United States Patent [19]
Ohkubo

[11] Patent Number: 6,009,010
[45] Date of Patent: Dec. 28, 1999

[54] STATIC SEMICONDUCTOR MEMORY DEVICE HAVING DATA LINES IN PARALLEL WITH POWER SUPPLY LINES

[75] Inventor: Hiroaki Ohkubo, Tokyo, Japan

[73] Assignee: NEC Corporation, Tokyo, Japan

[21] Appl. No.: 09/030,422

[22] Filed: Feb. 25, 1998

[30] Foreign Application Priority Data

Feb. 26, 1997 [JP] Japan ................................ 9-042152

[51] Int. Cl.$^6$ .................................................. G11C 11/00
[52] U.S. Cl. ................................ 365/154; 365/51; 365/63
[58] Field of Search ................................ 365/51, 63, 154

[56] References Cited

U.S. PATENT DOCUMENTS

| | | | |
|---|---|---|---|
| 5,724,293 | 3/1998 | Tomishima et al. | 365/51 |
| 5,815,454 | 9/1998 | Tomishima et al. | 365/51 |
| 5,867,440 | 2/1999 | Hidaka | 365/51 |

FOREIGN PATENT DOCUMENTS

| | | |
|---|---|---|
| 60-4253 | 1/1985 | Japan . |
| 62-169472 | 7/1987 | Japan . |
| 3-45551 | 7/1991 | Japan . |
| 8-97298 | 4/1996 | Japan . |
| 8-274190 | 10/1996 | Japan . |

OTHER PUBLICATIONS

Sekiyama et al., "A 1–V Operating 256–kb Full–CMOS SRAM", *IEEE Journal of Solid–State Circuits*, vol. 27, No. 5, May 1992, pp. 776–782.

Horiba et al., "A Symmetric Diagonal Driver Transistor SRAM Cell . . . Stable Low Voltage Operation", *1996 Symposium on VLSI Technology Digest of Technical Papers*, 1996, pp. 144–145.

*Primary Examiner*—David Nelms
*Assistant Examiner*—Van Thu Nguyen
*Attorney, Agent, or Firm*—Sughrue, Mion, Zinn, Macpeak & Seas, PLLC

[57] ABSTRACT

In a static memory cell including two load resistors connected to a power supply line, two cross-coupled drive transistors connected between the load resistors and two ground lines and two transfer transistors connected between the load resistors and two data lines, the data lines are in parallel with and do not cross over the power supply line and the ground lines.

17 Claims, 29 Drawing Sheets

ONE SRAM CELL

ONE SRAM CELL

ONE SRAM CELL

ONE SRAM CELL

STATIC SEMICONDUCTOR MEMORY DEVICE HAVING DATA LINES IN PARALLEL WITH POWER SUPPLY LINES

BACKGROUND OF THE INVENTION

1. Field of the Invention

The present invention relates to a static semiconductor memory device, and more particularly, to the improvement of a static memory cell of a static random access memory (SRAM) device.

2. Description of the Related Art

A prior art SRAM cell is constructed by a flip-flop formed by cross-coupled first and second inverters and transfer transistors connected between first and second nodes of the flip-flop and data lines. That is, the first inverter is formed by a first load resistor between a power supply line and the first node and a drive MOS transistor between the first node and a ground line. Similarly, the second inverter is formed by a second load resistor element between the power supply line and the second node and a second drive MOS transistor between the second node and the ground line.

In the above-described prior art SRAM cell, however, since the data lines cross over at least one of the power supply line and the ground line, the parasitic capacitances of the data lines are increased, which decreases the access speed of the SRAM cell. This will be explained later in detail.

SUMMARY OF THE INVENTION

It is an object of the present invention to increase the access speed of an SRAM cell.

According to the present invention, in a static memory cell including two load resistors connected to a power supply line, two cross-coupled drive transistors connected between the load resistors and two ground lines and two transfer transistors connected between the load resistors and two data lines, the data lines are in parallel with and do not cross over the power supply line and the ground lines. Thus, the parasitic capacitances of the data lines are decreased.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before describing the preferred embodiments, prior art SRAM cell will be explained with reference to FIGS. 1 through 15.

Figure 1:
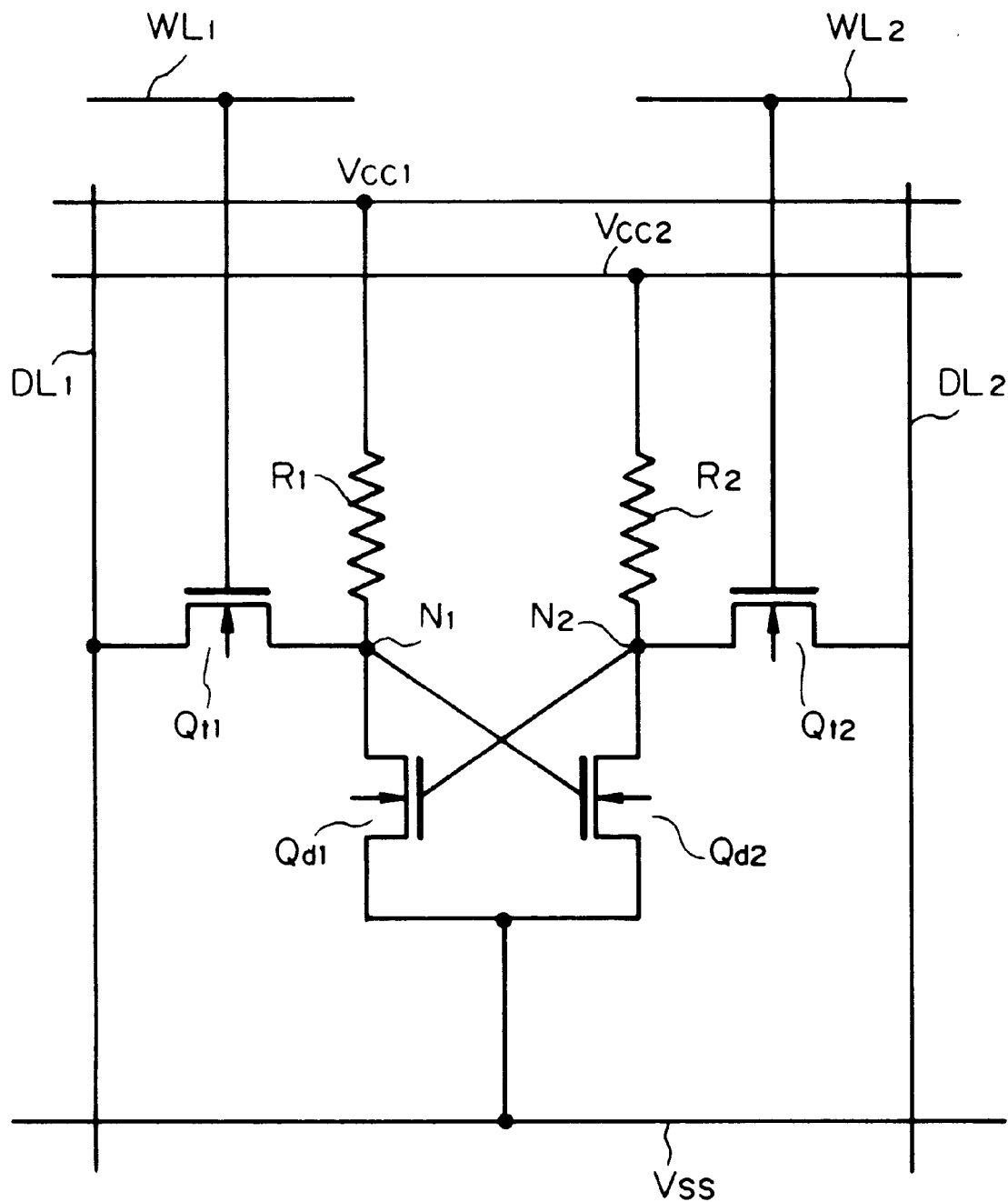
FIG. 1 is an equivalent circuit diagram illustrating a prior art symmetrical resistor-type SRAM cell.

In FIG. 1, which is an equivalent circuit diagram illustrating a prior art symmetrical resistor-type SRAM cell, one SRAM cell is provided at each intersection between word lines $WL_1$ and $WL_2$ and two complementary data lines $DL_1$ and $DL_2$. This memory cell is constructed by a flip-flop formed by two cross-coupled inverters and transfer N-channel MOS transistor $Q_{t1}$ and $Q_{t2}$ connected between nodes $N_1$ and $N_2$ of the flip-flop and the data lines $DL_1$ and $DL_2$.

The transfer transistors $Q_{t1}$ and $Q_{t2}$ are controlled by the voltages at the word lines $WL_1$, respectively and $WL_2$. In this case, note that the voltage at the word line $WL_1$ is the same as that at the word line $WL_2$.

Each of the inverters includes a load resistor $R_1(R_2)$ and a drive N-channel MOS transistor $Q_{d1}(Q_{d2})$ between a high power supply line $V_{cc1}(V_{cc2})$ and a lower power supply (ground) line $V_{ss}$. In this case, the voltage at the high power supply line $V_{cc1}$ is the same as that at the high power supply line $V_{cc2}$. The node $N_1$ is connected to a gate of the drive transistor $Q_{d2}$, so that the drive transistor $Q_{d2}$ is driven by the voltage at the node $N_1$. Also, the node $N_2$ is connected to a gate of the drive transistor $Q_{d1}$, so that the drive transistor $Q_{d1}$ is driven by the voltage at the node $N_2$.

In FIG. 1, the data lines $DL_1$ and $DL_2$ are perpendicular to the high power supply lines $V_{cc1}$ and $V_{cc2}$ and the ground line $V_{ss}$, in other words, the data lines $DL_1$ amd $DL_2$ cross over the high power supply lines $V_{cc1}$ and $V_{cc2}$ and the ground lines $V_{ss}$.

Figure 2:
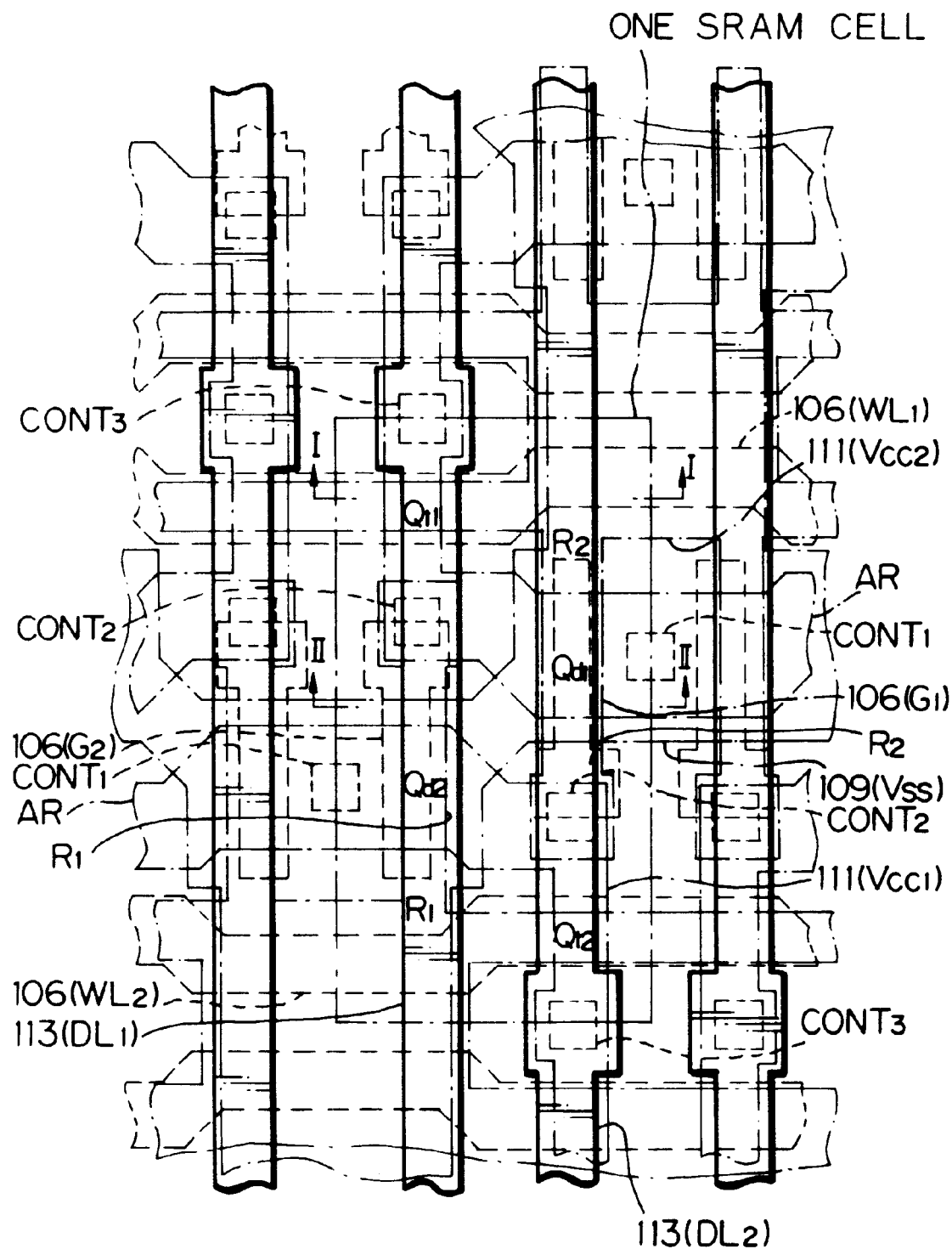
FIG. 2 is a plan view of the SRAM cell of FIG. 1.
Figure 3:
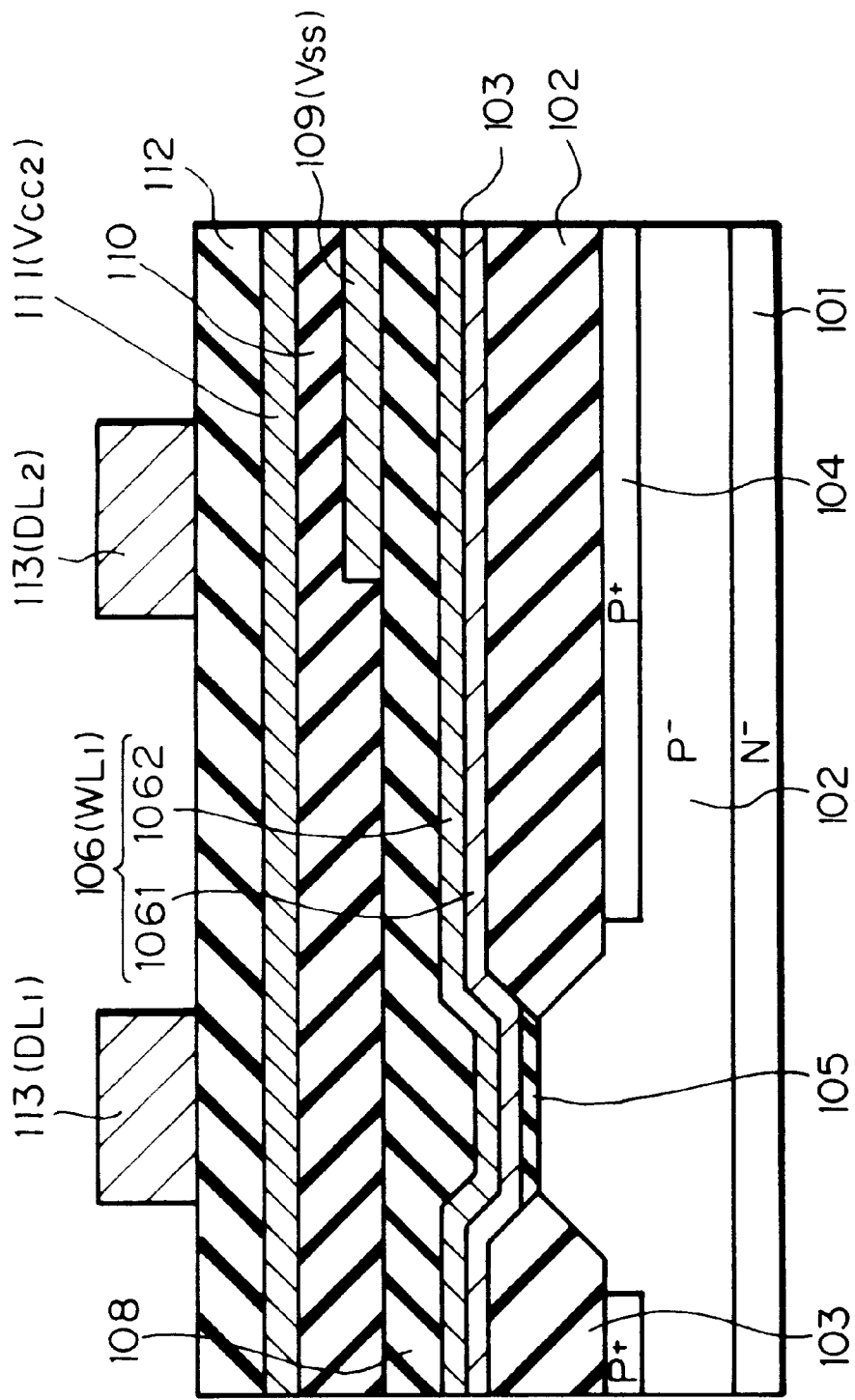
FIGS. 3 and 4 are cross-sectional views taken along the lines I—I and II—II, respectively, of FIG. 2.
Figure 4:
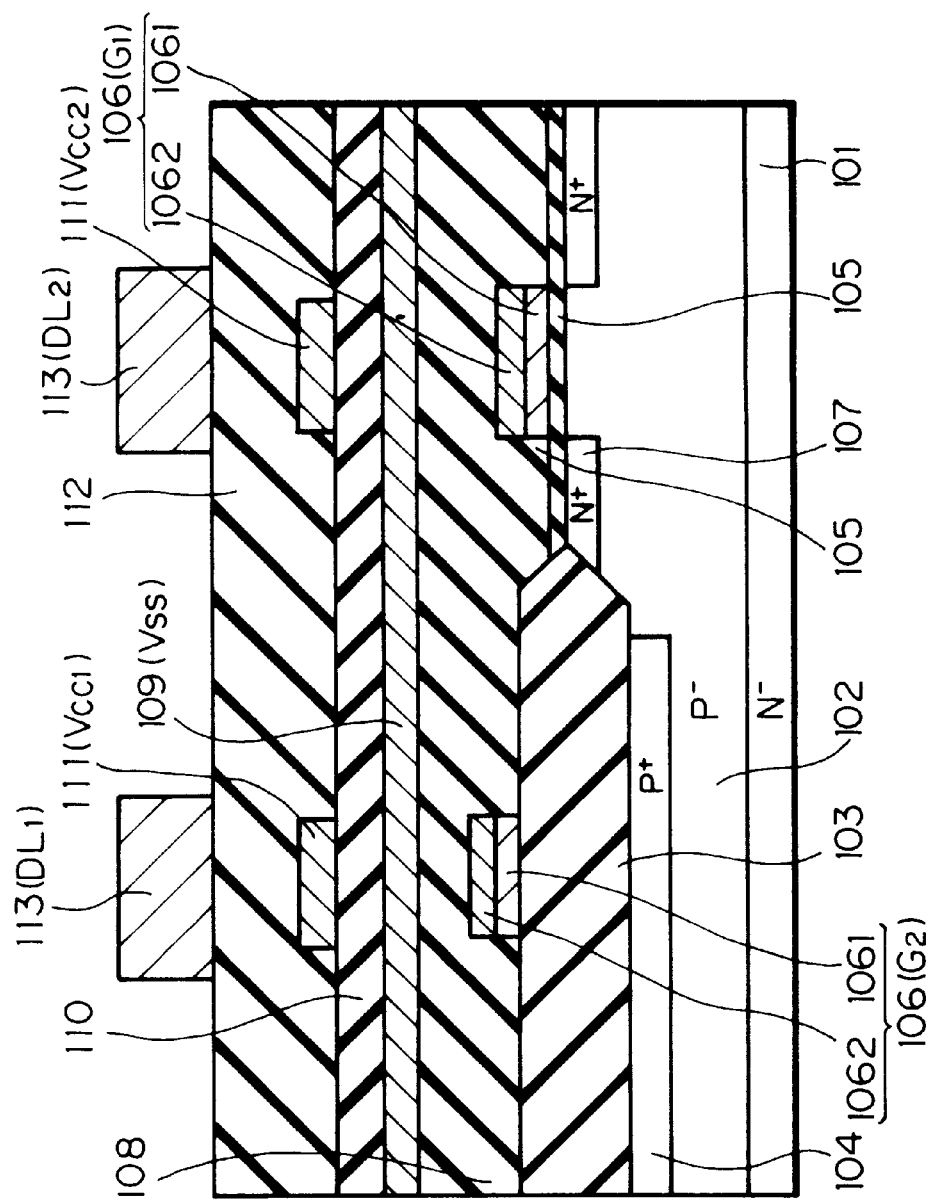

FIG. 2 is a plan view of the SRAM cell of FIG. 1, and FIGS. 3 and 4 are cross-sectional views taken along the lines I—I and II—II, respectively, of FIG. 2. Note that an area surrounded by a solid-dot line designates one SRAM cell.

The SRAM cell of FIG. 1 is explained next with reference to FIGS. 5 through 9 as well as FIGS. 2, 3 and 4.

Reference numeral 101 designates an $N^-$-type monocrystalline silicon substrate having an impurity concentration of about $10^{15}/\text{cm}^3$ on which a $P^-$-type well 102 having an impurity concentration of about $10^{16}$ to $10^{17}/\text{cm}^3$ is grown.

Figure 5:
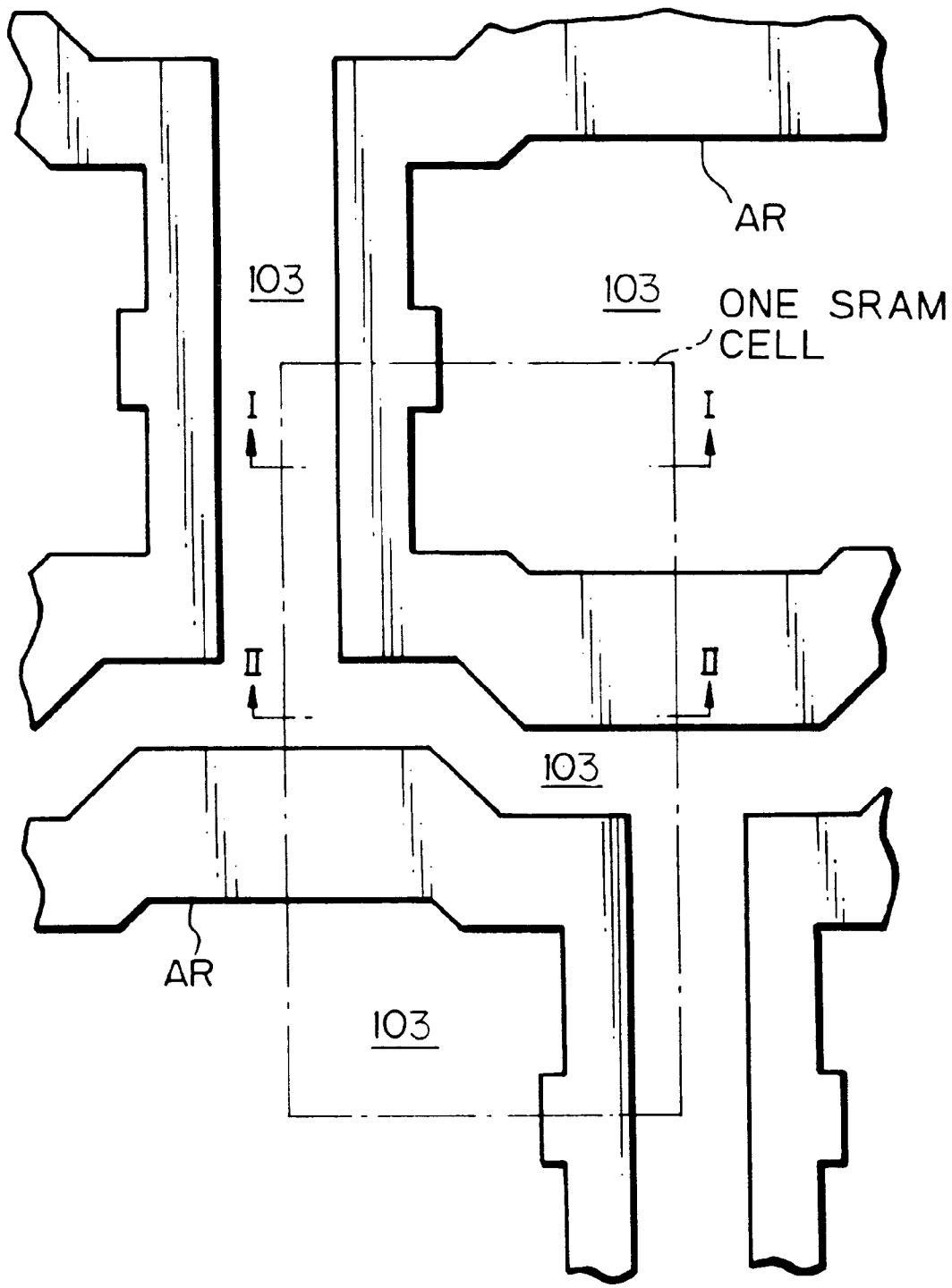
FIG. 5 is a plan view of the active area of the SRAM cell of FIG. 2.

The substrate 101 is thermally oxidized to form a field silicon oxide layer 103 about 200 to 500 nm thick by a local oxidation of silicon (LOCOS) process. In this case, a $P^+$-type channel stopper 104 having an impurity concentration of about $10^{17}$ to $10^{18}/\text{cm}^3$ is formed beneath the field silicon oxide layer 103. Note that the field silicon oxide layer 103 defines an active area AR as illustrated in FIG. 5.

Figure 6:
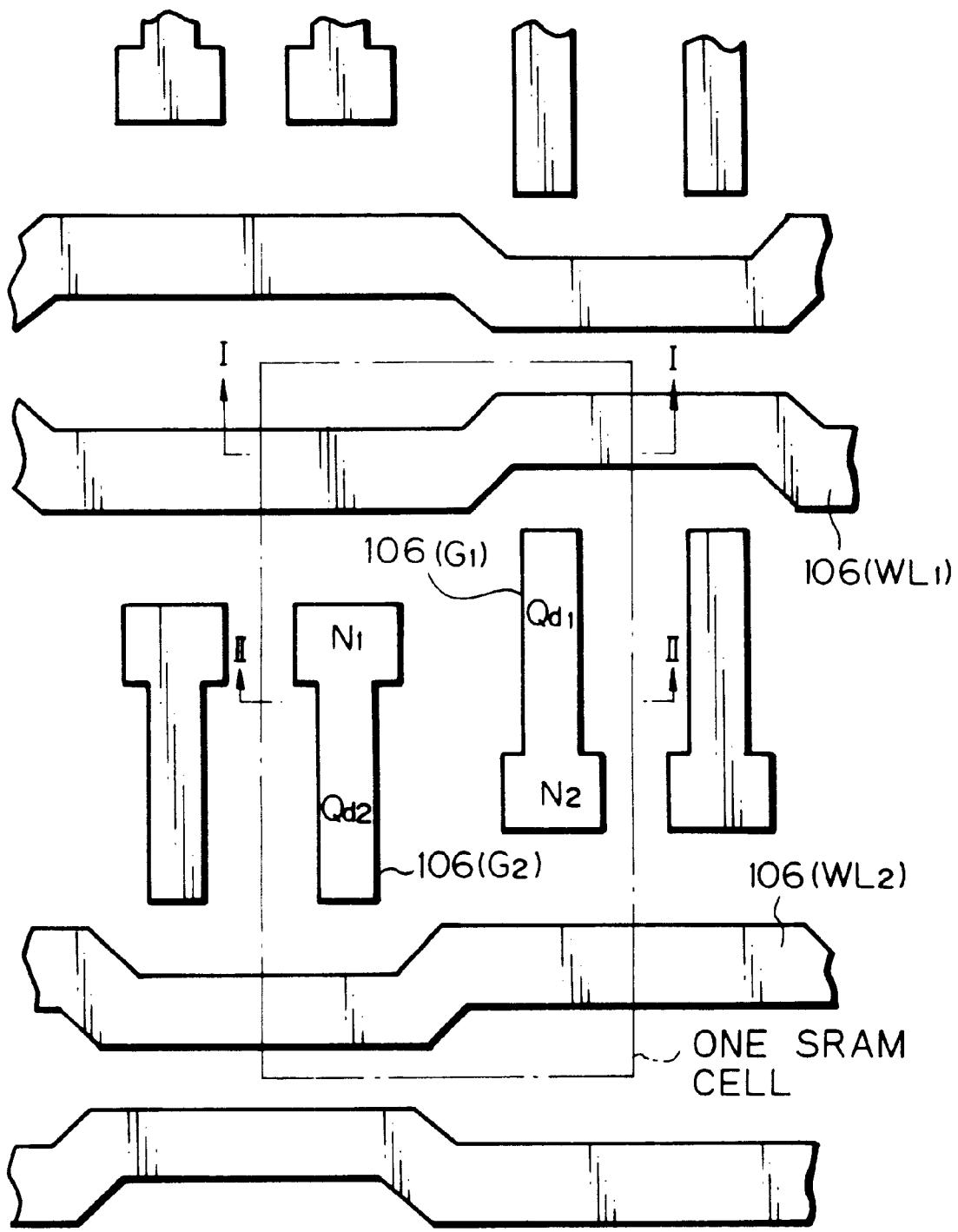
FIG. 6 is a plan view of the gate electrode of the SRAM cell of FIG. 2.

The substrate 101 is thermally oxidized to form a gate silicon oxide 105 about 5 to 20 nm thick, in the active area AR. Also, a gate electrode layer 106 including a polycrystalline silicon layer 1061 about 50 to 200 nm thick and a tungsten silicide layer 1062 about 100 to 200 nm thick are formed on the field silicon oxide layer 103 and the gate silicon oxide layer 105. The gate electrode 106 forms the word lines $WL_1$ and $WL_2$, a gate $G_1$ of the drive transistor $Q_{d1}$ and a gate $G_2$ of the drive transistor $Q_{d2}$ as illustrated in FIG. 6. Further, phosphorous or arsenic ions are implanted into the well 102 using the gate electrode 106 as a mask to form $N^+$-type impurity diffusion regions 107 having an impurity concentration of about $10^{20}$ to $10^{21}/\text{cm}^3$.

Figure 7:
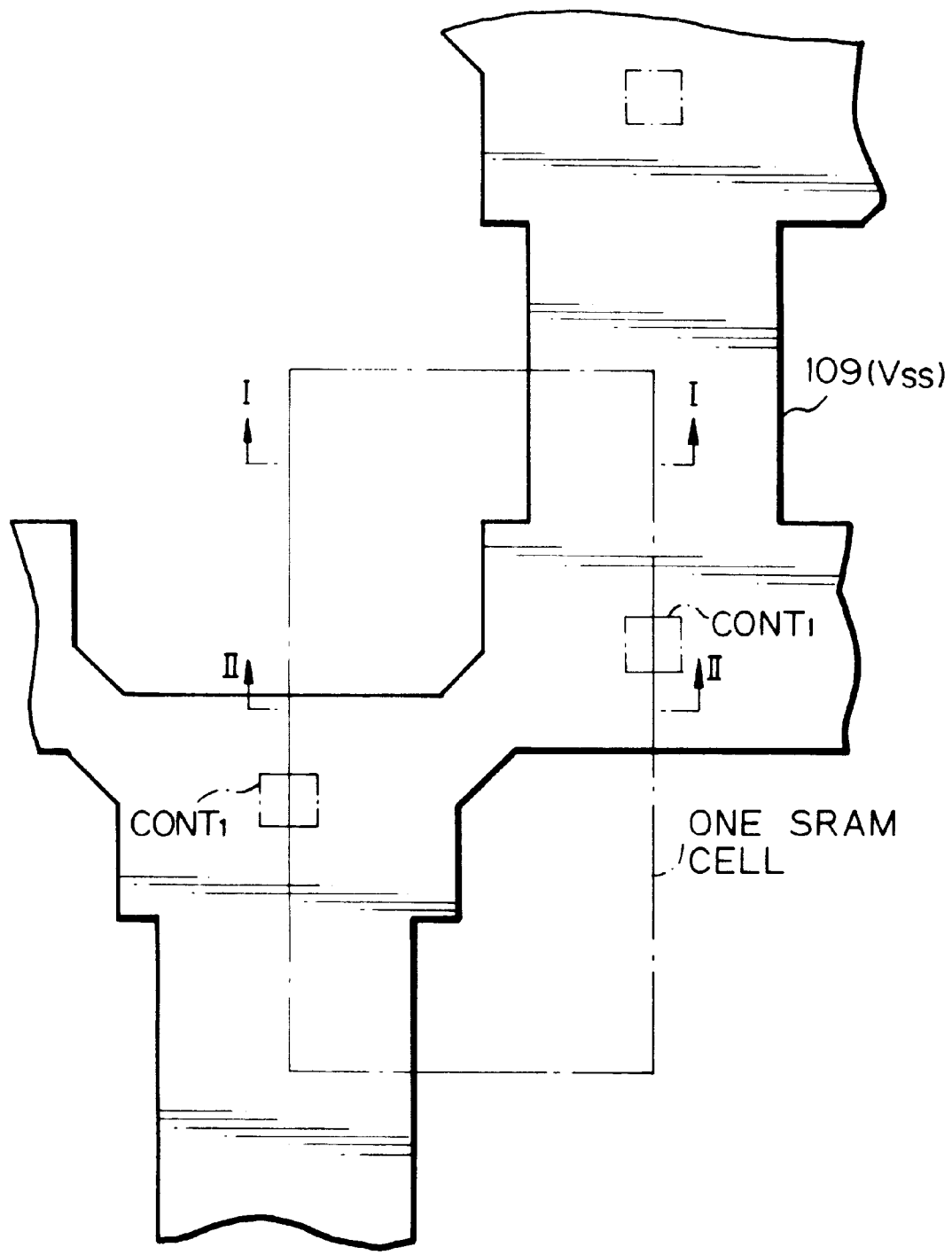
FIG. 7 is a plan view of the ground line of the SRAM cell of FIG. 2.

In addition, an insulating layer 108 is formed on the entire surface by using a chemical vapor deposition (CVD) process, and contact holes $CONT_1$ are perforated in the insulating layer 108 (see: FIG. 7). A tungsten silicide layer 109 as the ground line $V_{ss}$ is formed on the insulating layer 108 and is connected via the contact holes $CONT_1$ to the sources of the drive transistors $Q_{d1}$ and $Q_{d2}$ as illustrated in FIG. 7.

Figure 8:
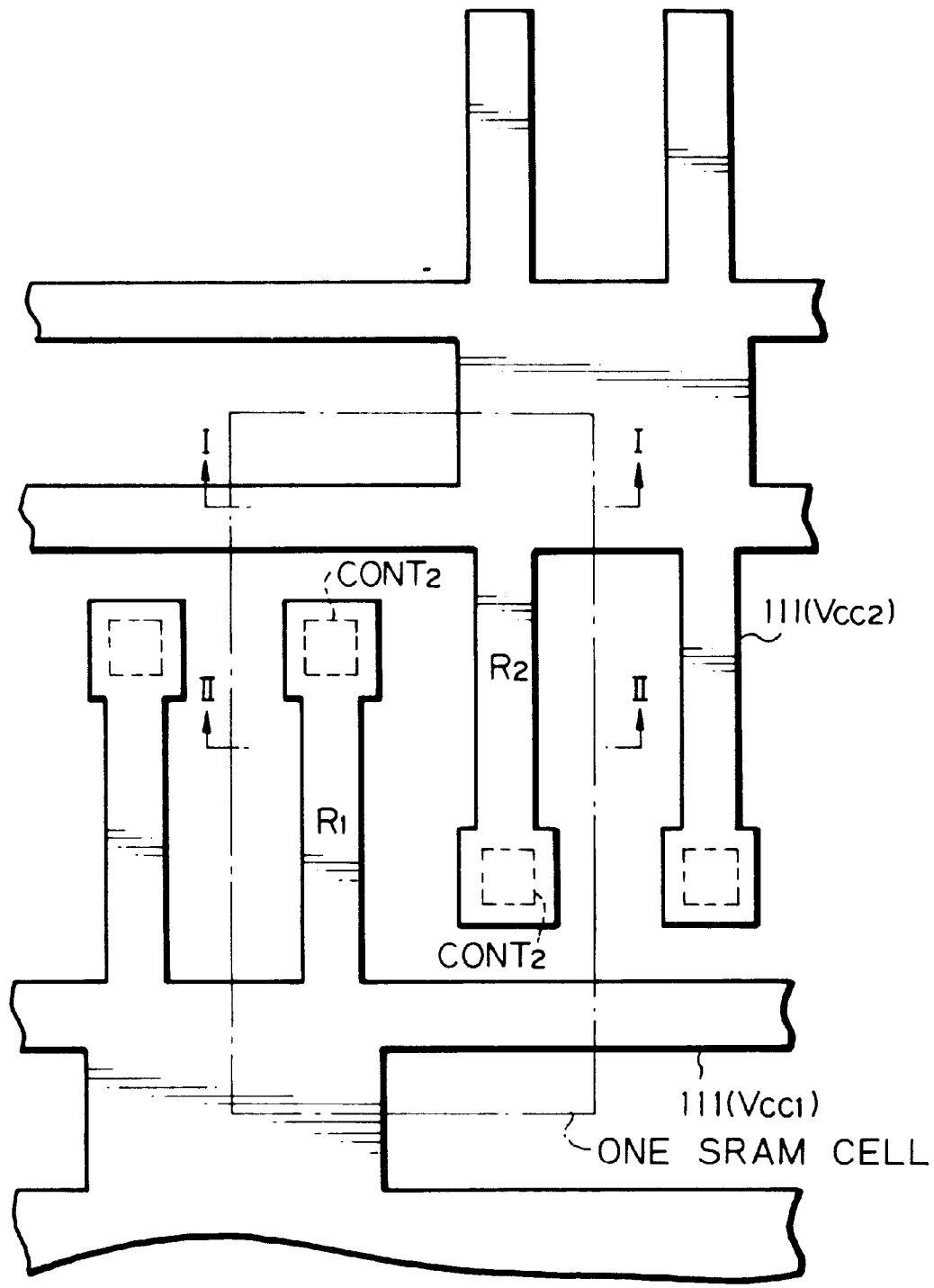
FIG. 8 is a plan view of the high power supply lines and the resistors of the SRAM cell of FIG. 2.

Further, an insulating layer 110 is formed on the entire surface by using a CVD process, and contact holes $CONT_2$ are perforated in the insulating layer 110 (see: FIG. 8). A polycrystalline silicon layer 111 as the high power supply lines $V_{cc1}$ and $V_{cc2}$ is formed on the insulating layer 110 and is connected via the contact holes $CONT_2$ to the nodes $N_1$ and $N_2$ as illustrated in FIG. 8. In this case, N-type impurities are introduced into the polycrystalline silicon layer 111 except for the portions indicated by $R_1$ and $R_2$. Thus, the portions $R_1$ and $R_2$ serve as high resistance resistors.

Figure 9:
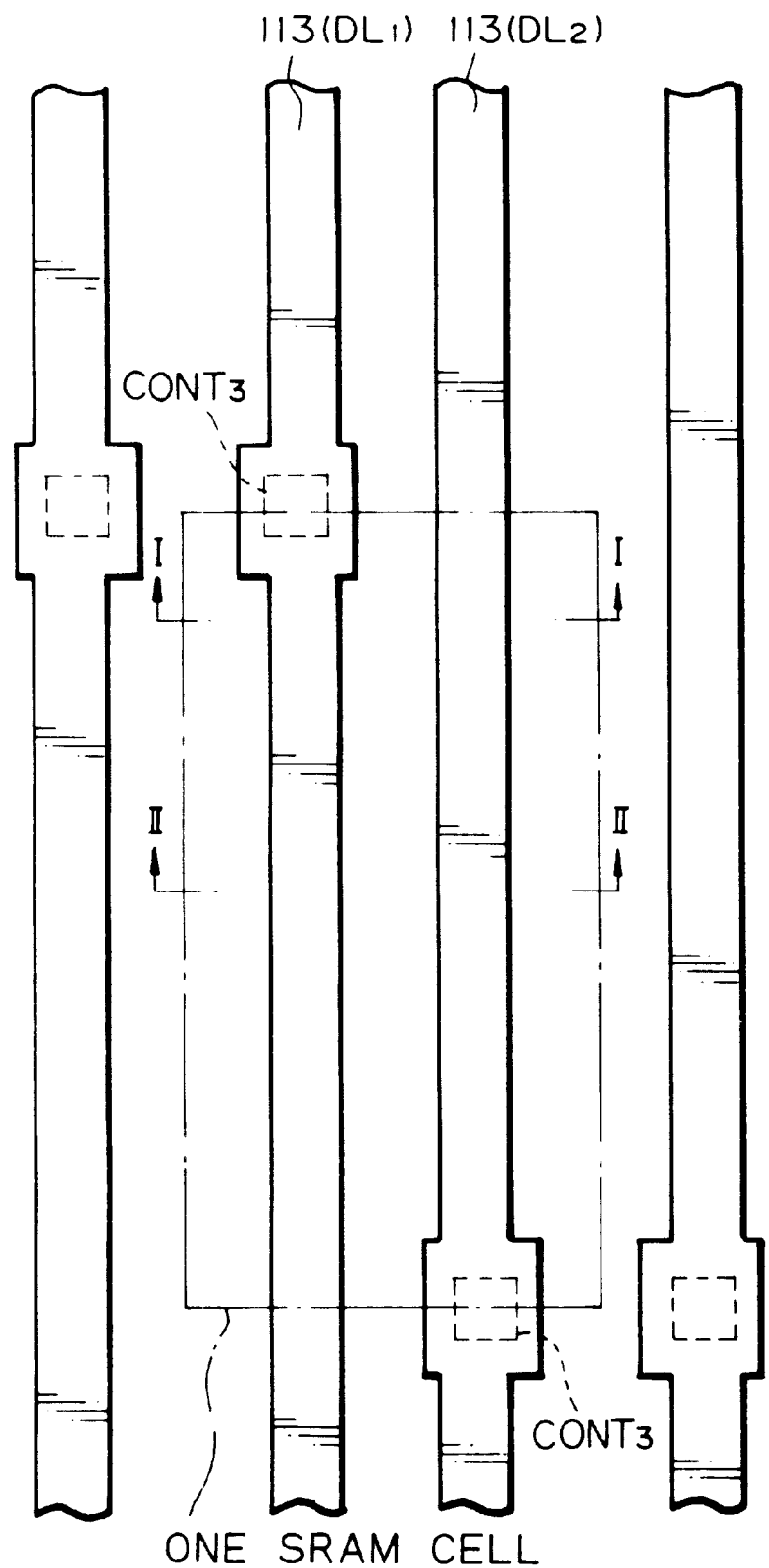
FIG. 9 is a plan view of the data lines of the SRAM cell of FIG. 2.

Finally, an insulating layer 112 is formed on the entire surface by using a CVD process, and contact holes $CONT_3$ are perforated in the insulating layer 112 (see: FIG. 9). An aluminum layer 113 as the data lines $DL_1$ and $DL_2$ is formed on the insulating layer 112 and is connected via the contact holes $CONT_3$ to the sources of the transfer transistors $Q_{t1}$ and $Q_{t2}$ as illustrated in FIG. 9.

In the SRAM cell, as illustrated in FIGS. 1 through 9, since the data lines $DL_1$ and $DL_2$ cross over the power supply lines $V_{cc1}$ and $V_{cc2}$ and the ground line $V_{ss}$, capacitances are formed by the data lines $DL_1$ and $DL_2$ and the lines $V_{cc1}$, $V_{cc2}$ and $V_{ss}$ with the insulating layer 110 and 112 thereby increasing the parasitic capacitances of the data lines $DL_1$ and $DL_2$, which decreases the access speed to the SRAM cell. In addition, since the resistors $R_1$ and $R_2$ connected to the power supply lines $V_{cc1}$ and $V_{cc2}$ oppose the data lines $DL_1$ and $DL_2$, respectively, capacitances formed by the data lines $DL_1$ and $DL_2$ and the resistors $R_1$ and $R_2$ with the insulating layer 112 therebetween, also increase the parasitic capacitances of the data lines $DL_1$ and $DL_2$, which further decreases the access speed of the SRAM cell. Note that, if the resistors $R_1$ and $R_2$ are arranged along the data lines $DL_1$ and $DL_2$, but not under the data lines $DL_1$ and $DL_2$, the area of the SRAM cell is increased, which decreases the integration.

Figure 10:
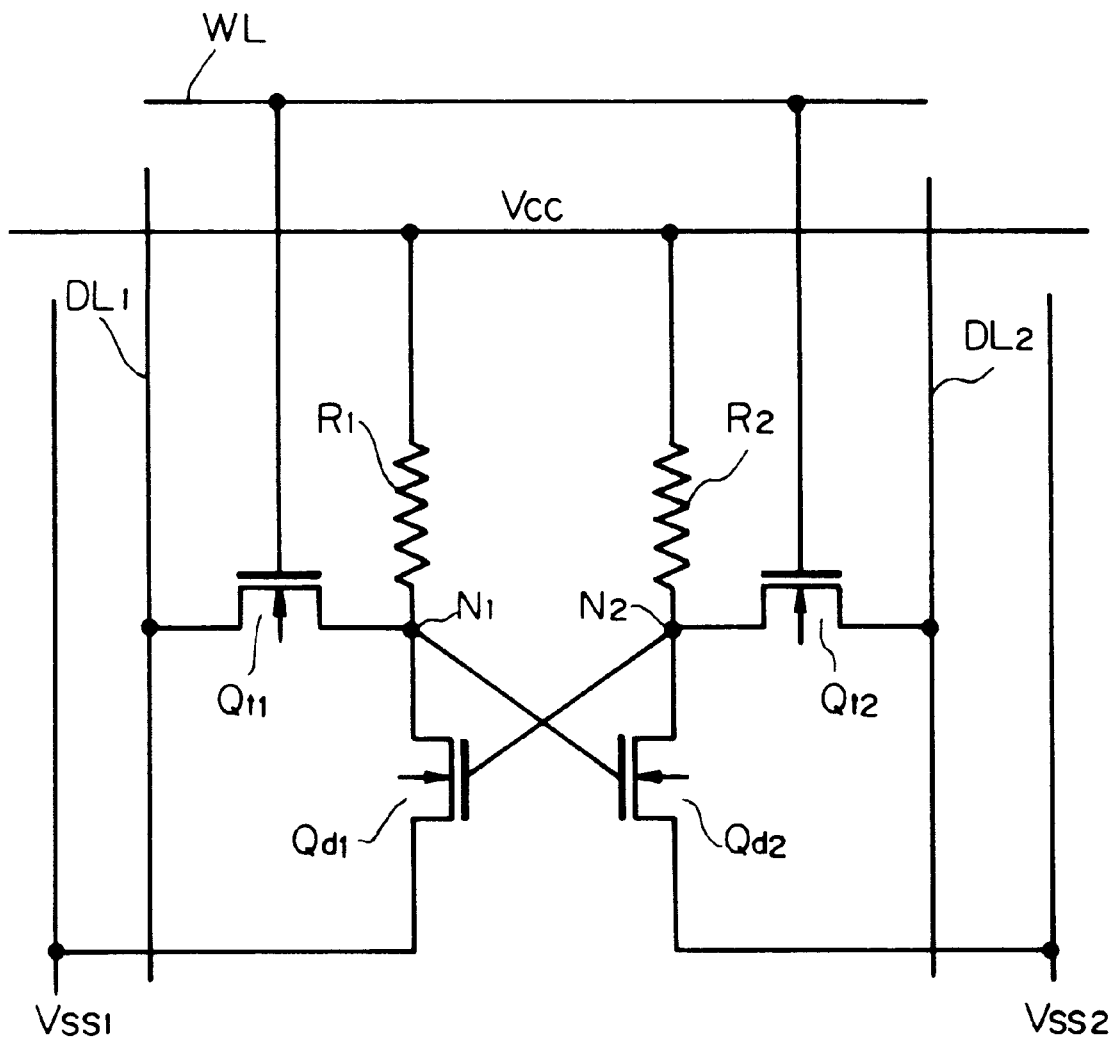
FIG. 10 is an equivalent circuit diagram illustrating a prior art asymmetrical resistor-type SRAM cell.

In FIG. 10, which is an equivalent circuit diagram illustrating a prior art asymmetrical resistor-type SRAM cell (see: JP-A-60-4253), one word line WL is provided instead of the word lines $WL_1$ and $WL_2$ of FIG. 1, and one high power supply line $V_{cc}$ is provided instead of the high power supply lines $V_{cc1}$ and $V_{cc2}$ of FIG. 1. Also, two ground lines $V_{ss1}$ and $V_{ss2}$ are provided instead of the ground line $V_{ss}$ of FIG. 1.

In FIG. 10, the data lines $DL_1$ and $DL_2$ are arranged in parallel with the ground lines $V_{ss1}$ and $V_{ss2}$; however, the data lines $DL_1$ and $DL_2$ are perpendicular to the high power supply line $V_{cc}$, in other words, the data lines $DL_1$ and $DL_2$ cross over the high power supply line $V_{cc}$.

The SRAM cell of FIG. 10 is explained next with reference to FIG. 11 which is a plan view of the SRAM cell of FIG. 10.

Figure 11:
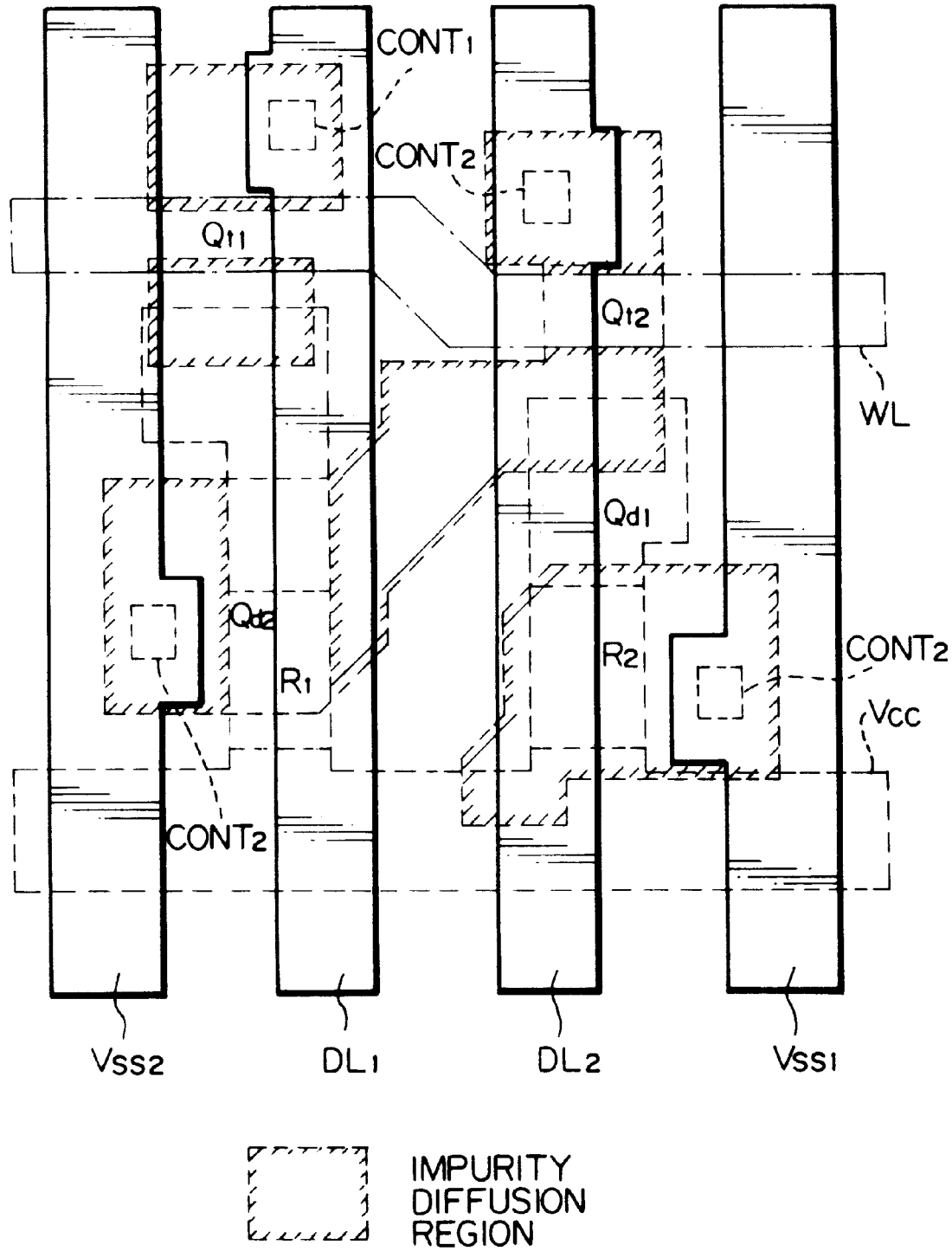
FIG. 11 is a plan view of the SRAM cell of FIG. 10.

In FIG. 11, impurity diffusion regions indicated by shaded portions are formed by partitioning a field silicon oxide layer (not shown). The impurity diffusion regions serve as source/drain regions of the transistors $Q_{t1}$, $Q_{t2}$, $Q_{d1}$ and $Q_{d2}$. Also, a first polycrystalline silicon layer is deposited and patterned to form the gates of the transistors $Q_{t1}$, $Q_{t2}$, $Q_{d1}$ and $Q_{d2}$ and the word line WL. Further, a second polycrystalline silicon layer is deposited and patterned to form the high power supply line $V_{cc}$ and the resistors $R_1$ and $R_2$ connected to the high power supply line $V_{cc}$. In this case, the resistance value of the resistor $R_1$ is brought close to that of the resistor $R_2$. Finally, an aluminum layer is deposited and patterned to form the data lines $DL_1$ and $DL_2$ and the ground lines $V_{ss1}$ and $V_{ss2}$. The data lines $DL_1$ and $DL_2$ are connected via contact holes $CONT_1$ to the impurity regions of the transfer transistors $Q_{t1}$ and $Q_{t2}$, and the ground lines $V_{ss1}$ and $V_{ss2}$ are connected via contact holes $CONT_2$ to the impurity diffusion regions of the drive transistors $Q_{d1}$ and $Q_{d2}$.

In the SRAM cell as illustrated in FIGS. 10 and 11, the ground lines $V_{ss1}$ and $V_{ss2}$ are arranged in parallel with the data lines $DL_1$ and $DL_2$ on the same surface so that the capacitances therebetween are small. However, the data lines $DL_1$ and $DL_2$ still cross over the power supply line $V_{cc}$, capacitances formed by the data lines $DL_1$ and $DL_2$ and the lines $V_{cc}$ with the insulating layer therebetween increase the parasitic capacitances of the data lines $DL_1$ and $DL_2$, which decreases the access speed of the SRAM cell. In addition, since the resistors $R_1$ and $R_2$ connected to the power supply line $V_{cc}$ oppose the data lines $DL_1$ and $DL_2$, respectively, capacitances formed by the data lines $DL_1$ and $DL_2$ and the resistors $R_1$ and $R_2$ with the insulating layer therebetween also increase the parasitic capacitances of the data lines $DL_1$ and $DL_2$, which further decreases the access speed of the SRAM cell. In this case, note that, if the resistors $R_1$ and $R_2$ are arranged along the data lines $DL_1$ and $DL_2$, but not under the data lines $DL_1$ and $DL_2$, the area of the SRAM cell is increased, which decreases the integration.

Figure 12:
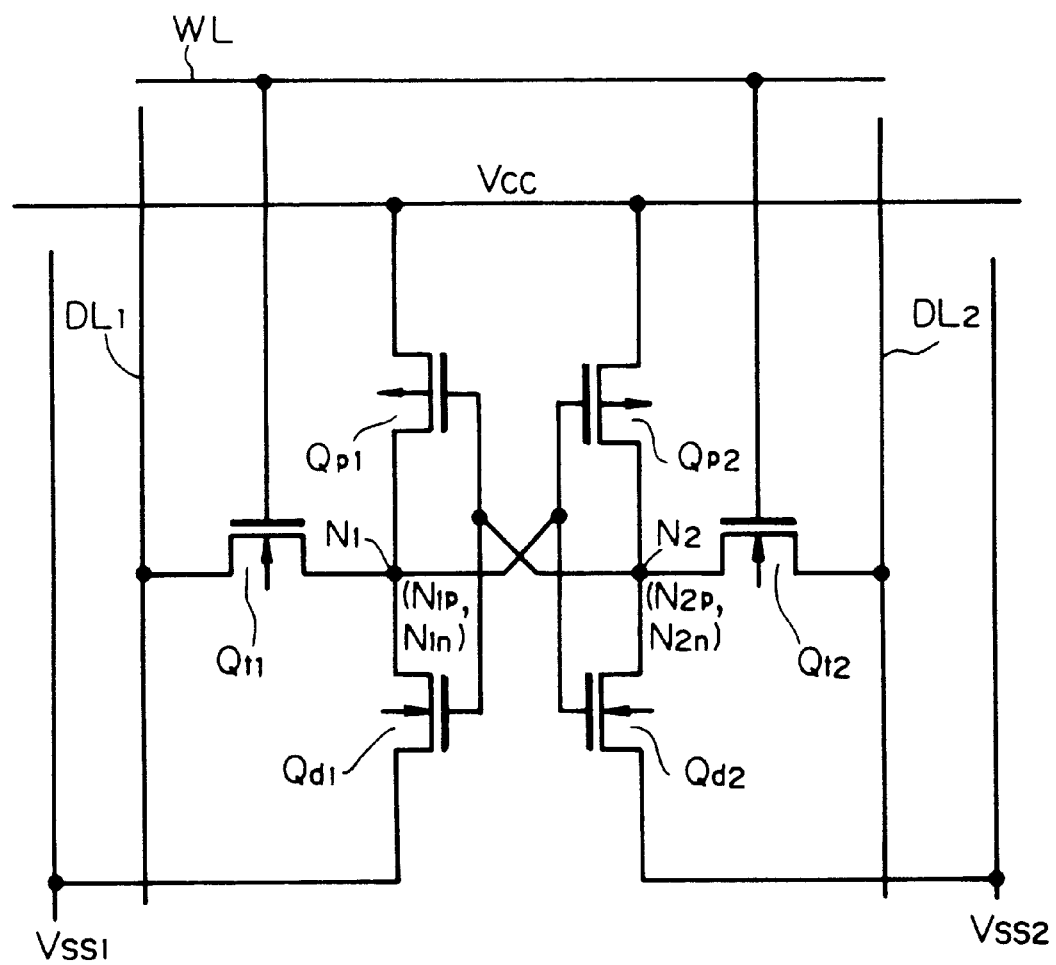
FIG. 12 is an equivalent circuit diagram illustrating a prior art CMOS-type SRAM cell.

In FIG. 12, which is an equivalent circuit diagram illustrating a prior art CMOS-type SRAM cell (see: A. Sekiyama et al., "A 1-V Operating 256-kb Full-CMOS SRAM", IEEE Journal of Solid-State Circuits, Vol. 27, No. 5, pp. 776–782, May 1992), P-channel MOS transistors $Q_{p1}$ and $Q_{p2}$ are provided instead of the resistors $R_1$ and $R_2$ of FIG. 10.

In FIG. 12, the data lines $DL_1$ and $DL_2$ are arranged in parallel with the ground lines $V_{ss1}$ and $V_{ss2}$; however, the data lines $DL_1$ and $DL_2$ are perpendicular to the high power supply line $V_{cc}$, in other words, the data lines $DL_1$ and $DL_2$ cross over the high power supply line $V_{cc}$.

The SRAM cell of FIG. 12 is explained next with reference to FIG. 13 which is a plan view of the SRAM cell of FIG. 12.

Figure 13:
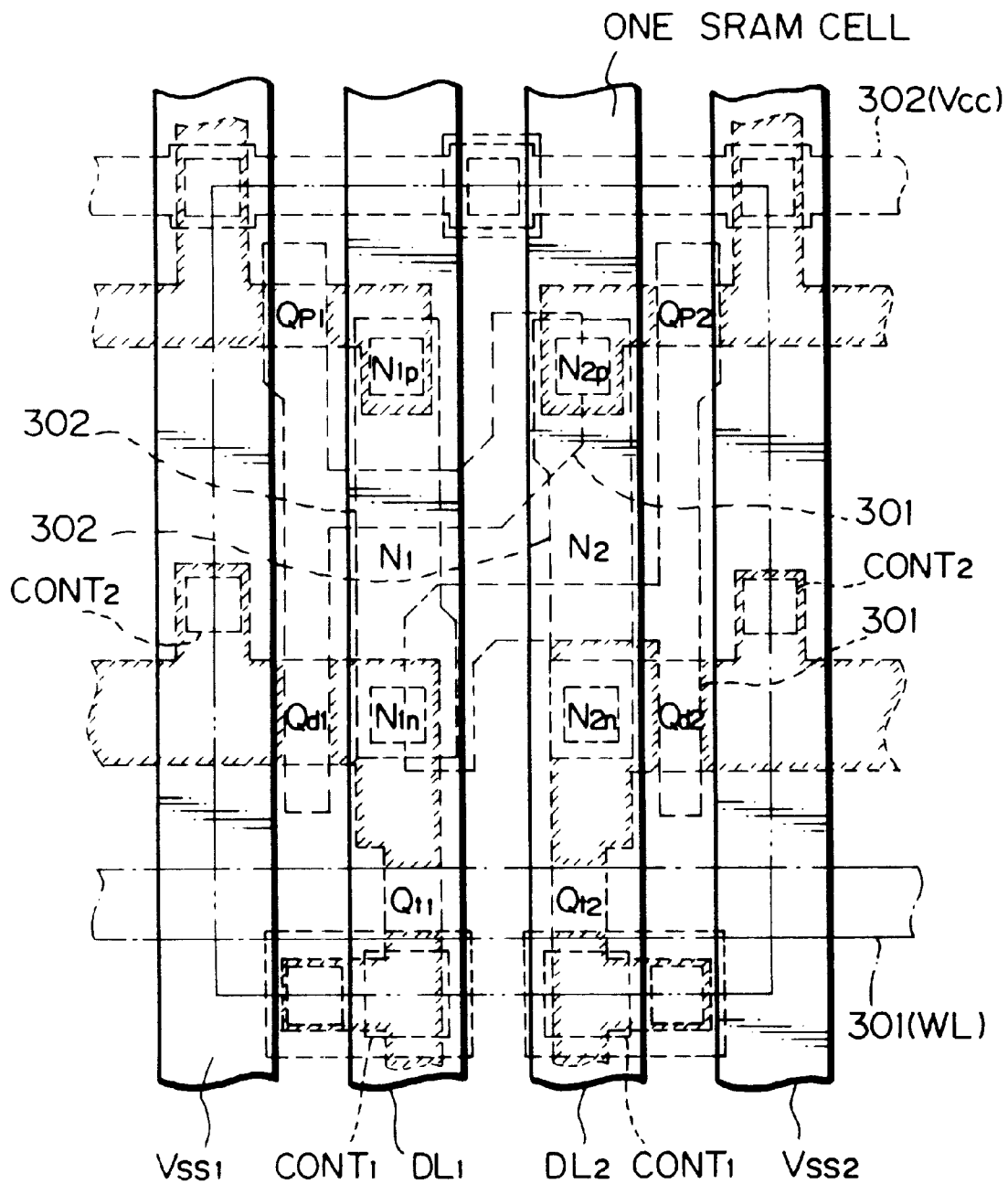
FIG. 13 is a plan view of the SRAM cell of FIG. 12.

In FIG. 13, P-type and N-type impurity diffusion regions indicated by shaded portions are formed by partitioning a field silicon oxide layer (not shown). In this case, the P-type impurity diffusion regions serve as source/drain regions of the transistors $Q_{p1}$ and $Q_{p2}$, and the N-type impurity diffusion regions serve as source/drain regions of the transistors $Q_{t1}$, $Q_{t2}$, $Q_{d1}$ and $Q_{d2}$. Also, a polycrystalline silicon layer is deposited and patterned to form the gates of the transistors $Q_{t1}$, $Q_{t2}$, $Q_{p1}$, $Q_{p2}$, $Q_{d1}$ and $Q_{d2}$ and the word line WL. Further, a first aluminum layer 302 is deposited and patterned to form the high power supply line $V_{cc}$ and connections forming the nodes $N_1$ and $N_2$. In this case, the node $N_1$ is denoted by $N_{1p}$ and $N_{1n}$ in FIG. 13, and the node $N_2$ is denoted by $N_{2p}$ and $N_{2n}$. Finally, a second aluminum layer is deposited and patterned to form the data lines $DL_1$ and $DL_2$ and the ground lines $V_{ss1}$ and $V_{ss2}$. The data lines $DL_1$ and $DL_2$ are connected via contact holes $CONT_1$ to the impurity regions of the transfer transistors $Q_{t1}$ and $Q_{t2}$, and the ground lines $V_{ss1}$ and $V_{ss2}$ are connected via contact holes $CONT_2$ to the impurity diffusion regions of the drive transistors $Q_{d1}$ and $Q_{d2}$.

In the SRAM cell as illustrated in FIGS. 12 and 13, the ground lines $V_{ss1}$ and $V_{ss2}$ are arranged in parallel with the data lines $DL_1$ and $DL_2$ on the same surface so that the capacitances therebetween are small. However the data lines $DL_1$ and $DL_2$ still cross over the power supply line $V_{cc}$, capacitances formed by the data lines $DL_1$ and $DL_2$ and the lines $V_{cc}$ with the insulating layer therebetween increase the parasitic capacitances of the data lines $DL_1$ and $DL_2$, which decreases the access speed of the SRAM cell.

Figure 14:
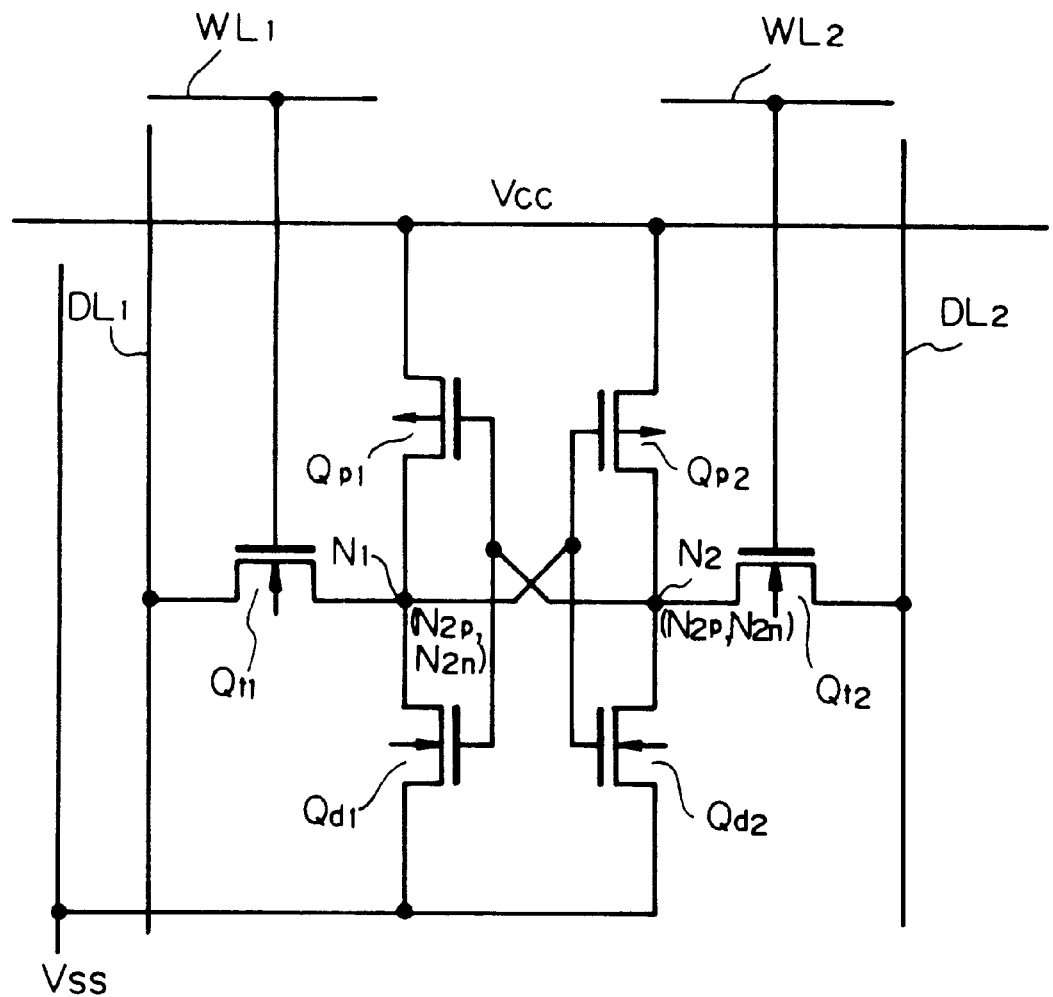
FIG. 14 is an equivalent circuit diagram illustrating another prior art CMOS-type SRAM cell.

In FIG. 14, which is an equivalent circuit diagram illustrating another prior art CMOS-type SRAM cell (see: JP-A-59-217356), one ground line $V_{ss}$ is provided instead of the ground lines $V_{ss1}$ and $V_{ss2}$ of FIG. 12, and two word lines $WL_1$ and $WL_2$ are provided instead of the word line WL of FIG. 12.

Even in FIG. 14, the data lines $DL_1$ and $DL_2$ are arranged in parallel with the ground line $V_{ss}$; however, the data lines $DL_1$ and $DL_2$ are perpendicular to the high power supply line $V_{cc}$, in other words, the data lines $DL_1$ and $DL_2$ cross over the high power supply line $V_{cc}$.

The SRAM cell of FIG. 14 is explained next with reference to FIG. 15 which is a plan view of the SRAM cell of FIG. 14.

Figure 15:
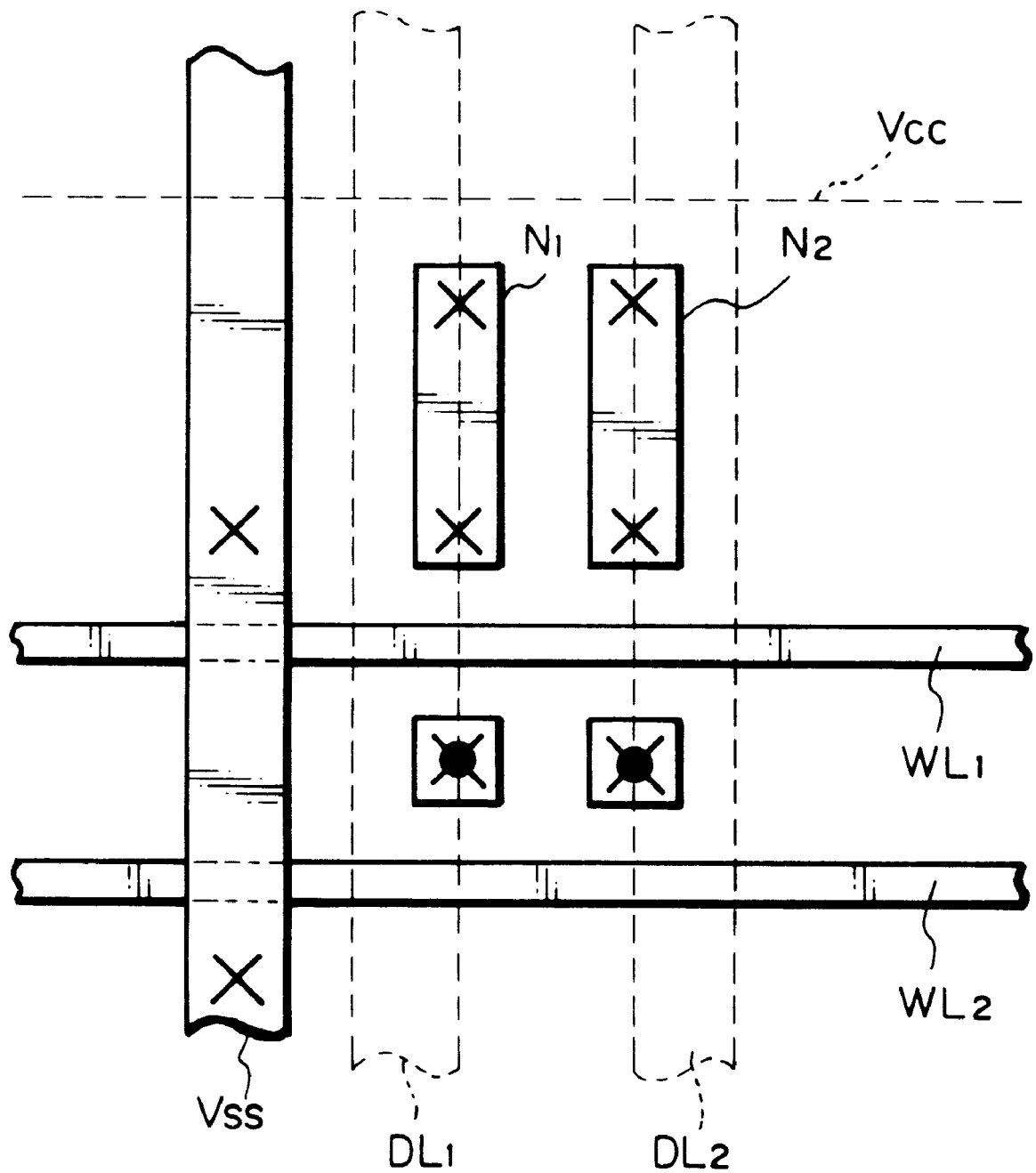
FIG. 15 is a plan view of the SRAM cell of FIG. 14.

In FIG. 15, the high power supply line $V_{cc}$ is formed by a P-type impurity diffusion region. Also, the word lines $WL_1$ and $WL_2$ and gates of the transistors (not shown) are formed by a polycrystalline silicon layer. Further, the ground line $V_{ss}$ and connections for the nodes $N_1$ and $N_2$ are formed by a first aluminum layer, and the data lines $DL_1$ and $DL_2$ are formed by a second aluminum layer. Note that marks indicated by "X" designate contact holes.

In the SRAM cell as illustrated in FIGS. 14 and 15, the ground line $V_{ss}$ is arranged in parallel with the data lines $DL_1$ and $DL_2$ and is distant therefrom so that the capacitances therebetween are small. Also, since the high power supply line $V_{cc}$ is formed by a P-type impurity diffusion region, the capacitances between the data lines $DL_1$ and $DL_2$ and the high power supply line $V_{cc}$ are also small. However, the P-type impurity region for the high power supply line $V_{cc}$ increases the area of the SRAM cell, which decreases the integration.

Figure 16:
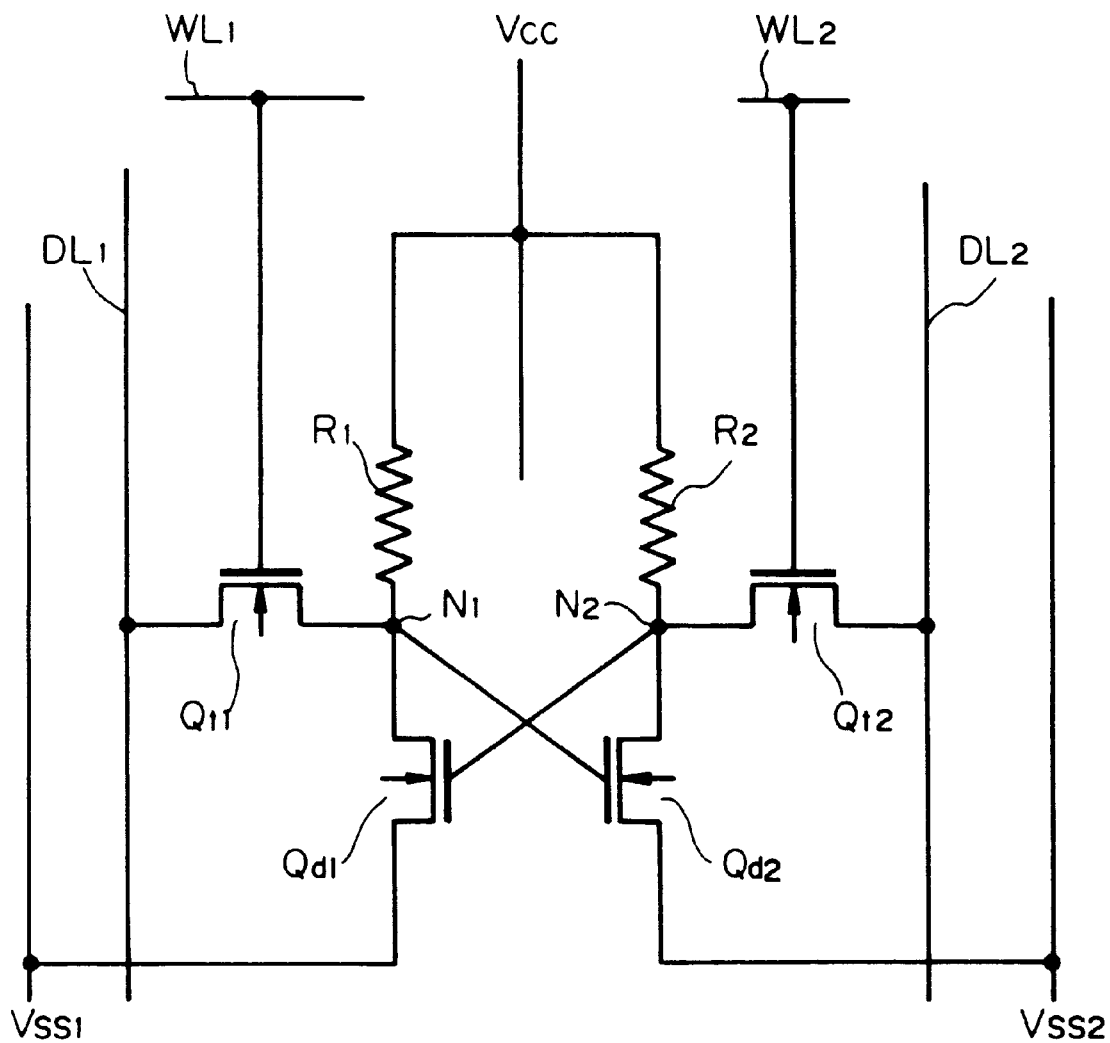
FIG. 16 is an equivalent circuit diagram illustrating a first embodiment of the symmetrical resistor-type SRAM cell according to the present invention.

In FIG. 16, which is an equivalent circuit diagram illustrating a first embodiment of the symmetrical SRAM cell according to the present invention, one word line WL is provided instead of the word lines $WL_1$ and $WL_2$ of FIG. 1, and one high power supply line $V_{cc}$ is provided instead of the high power supply lines $V_{cc1}$ and $V_{cc2}$ of FIG. 1. Also, two ground lines $V_{ss1}$ and $V_{ss2}$ are provided instead of the ground line $V_{ss}$ of FIG. 1.

In FIG. 16, the data lines $DL_1$ and $DL_2$ are arranged in parallel with the high power supply line $V_{cc}$ as well as the ground lines $V_{ss1}$ and $V_{ss2}$; in other words, the data lines $DL_1$ and $DL_2$ do not cross over the high power supply line $V_{cc}$ or the ground lines $V_{ss1}$ and $V_{ss2}$. This will be explained later in detail. Therefore, the capacitance between the data line $DL_1$ ($DL_2$) and the high power supply line $V_{cc}$ is small, and the capacitance between the data lines $DL_1$ ($DL_2$) and the ground lines $V_{ss1}$ and $V_{ss2}$ is small.

Figure 17:
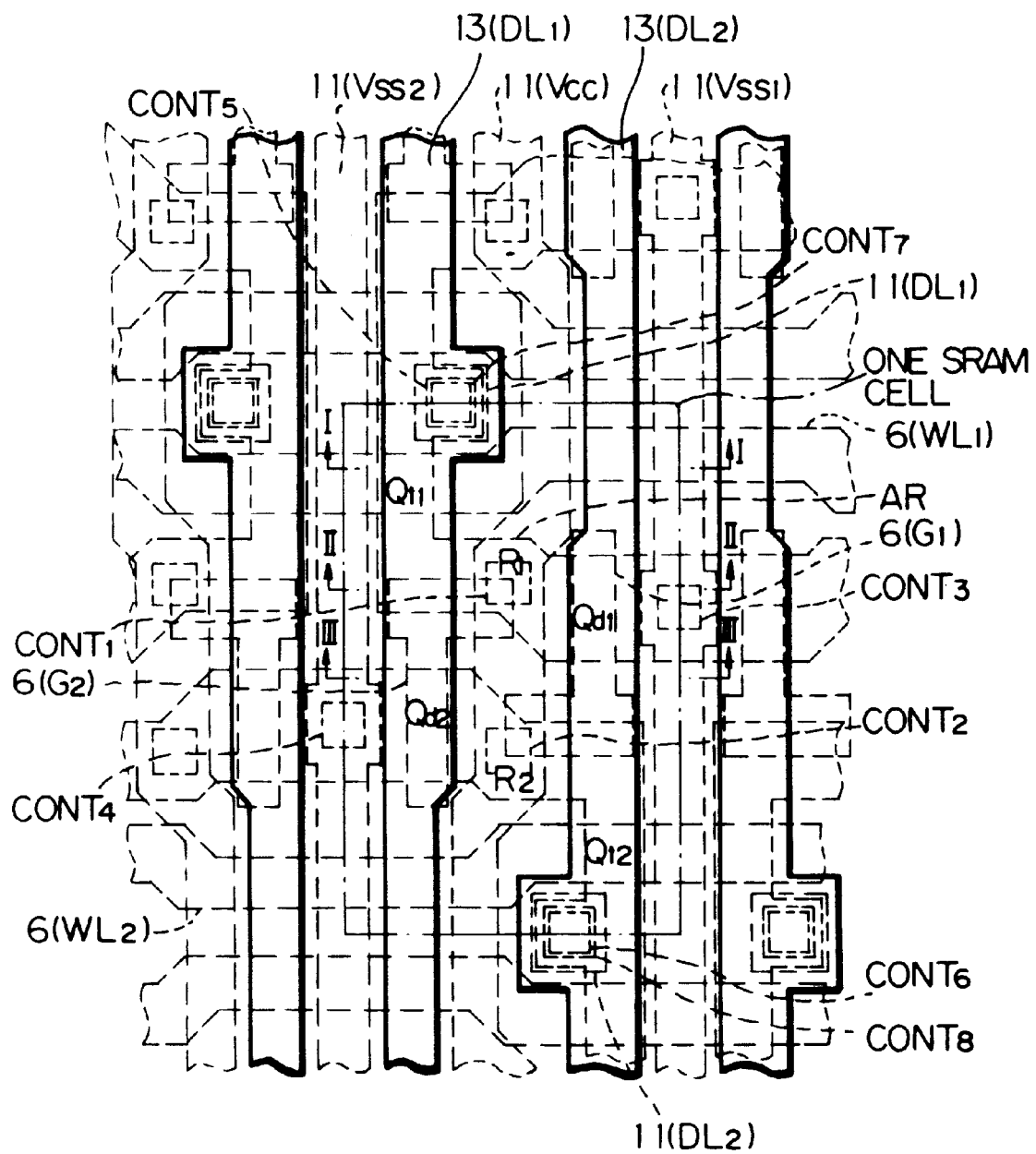
FIG. 17 is a plan view of the SRAM cell of FIG. 16.
Figure 18:
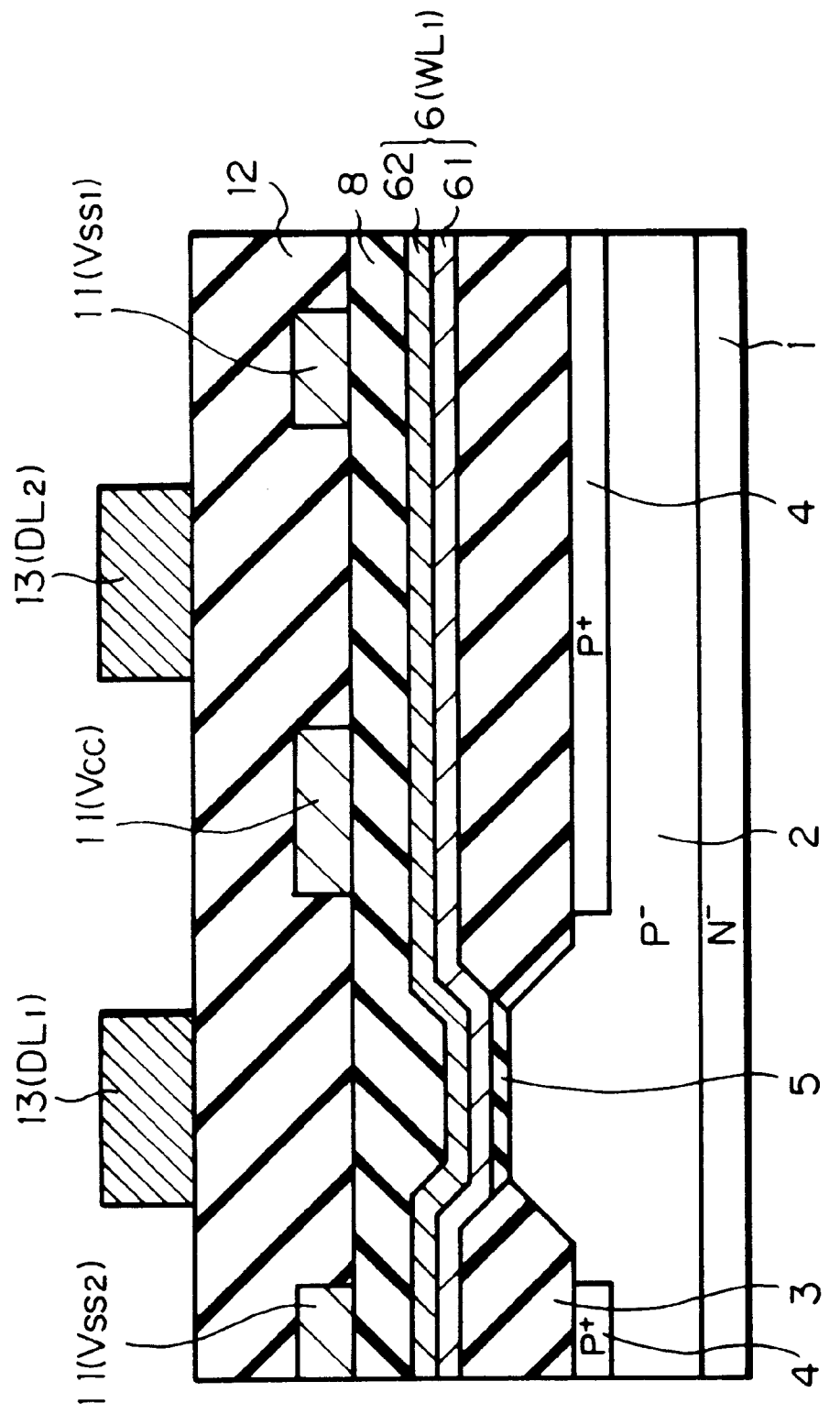
FIGS. 18, 19 and 20 are cross-sectional views taken along the lines I—I, II—II and III—III, respectively, of FIG. 17.

FIG. 17 is a plan view of the SRAM cell of FIG. 16, and FIGS. 18, 19 and 20 are cross-sectional views taken along the lines I—I, II—II and III—III respectively, of FIG. 17. Note that an area surrounded by a solid-dot line designates one SRAM cell.

The SRAM cell of FIG. 16 is explained next with reference to FIGS. 21 through 26 as well as FIGS. 17, 18, 19 and 20.

Reference numeral 1 designates an N⁻-type monocrystalline silicon substrate having an impurity concentration of about $10^{15}/cm^3$ on which a P⁻-type well 2 having an impurity concentration of about $10^{16}$ to $10^{17}/cm^3$ is grown.

Figure 21:
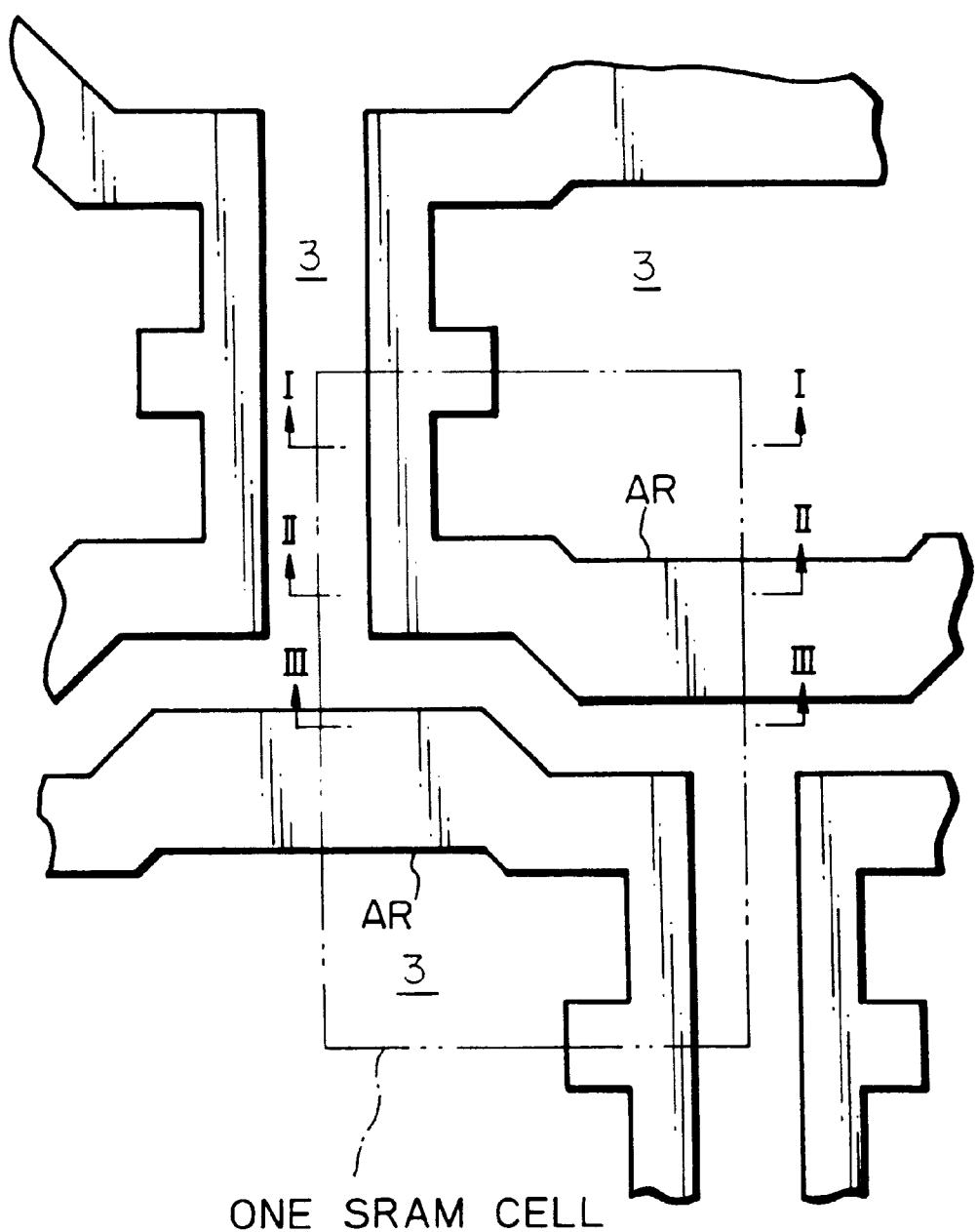
FIG. 21 is a plan view of the active area of the SRAM cell of FIG. 17.

The substrate 1 is thermally oxidized to form a field silicon oxide layer 3 about 200 to 500 nm thick by a LOCOS process. In this case, a P⁺-type channel stopper 4 having an impurity concentration of about $10^{17}$ to $10^{19}/cm^3$ is formed beneath the field silicon oxide layer 3. Note that the field silicon oxide layer 3 defines an active area AR as illustrated in FIG. 21.

Figure 22:
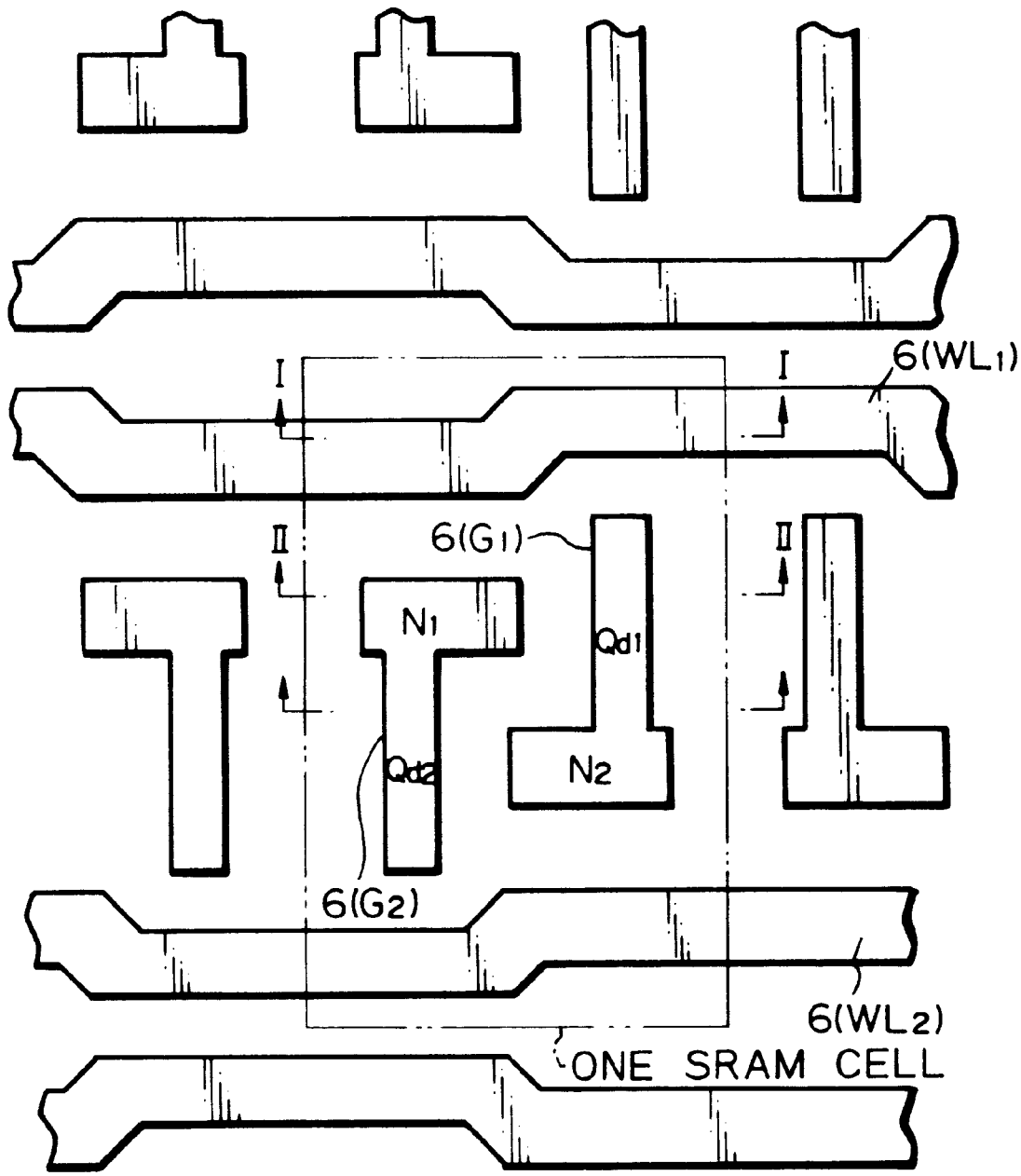
FIG. 22 is a plan view of the gate electrode of the SRAM cell of FIG. 17.

The substrate 1 is thermally oxidized to form gate silicon oxide 5 about 5 to 20 nm thick in the active area AR. Also, a gate electrode layer 6 including a polycrystalline silicon layer 61 about 50 to 200 nm thick and a tungsten silicide layer 62 about 100 to 200 nm thick are formed on the field silicon oxide layer 3 and the gate silicon oxide layer 5. The gate electrode 6 forms the word lines $WL_1$ and $WL_2$, a gate $G_1$ of the drive transistor $Q_{d1}$ and a gate $G_2$ of the drive transistor $Q_{d2}$ as illustrated in FIG. 22. Further, phosphorous or arsenic ions are implanted into the well 2 using the gate electrode 6 as a mask to form N⁺-type impurity diffusion regions 7 having an impurity concentration of about $10^{20}$ to $10^{21}/cm^3$.

Figure 23:
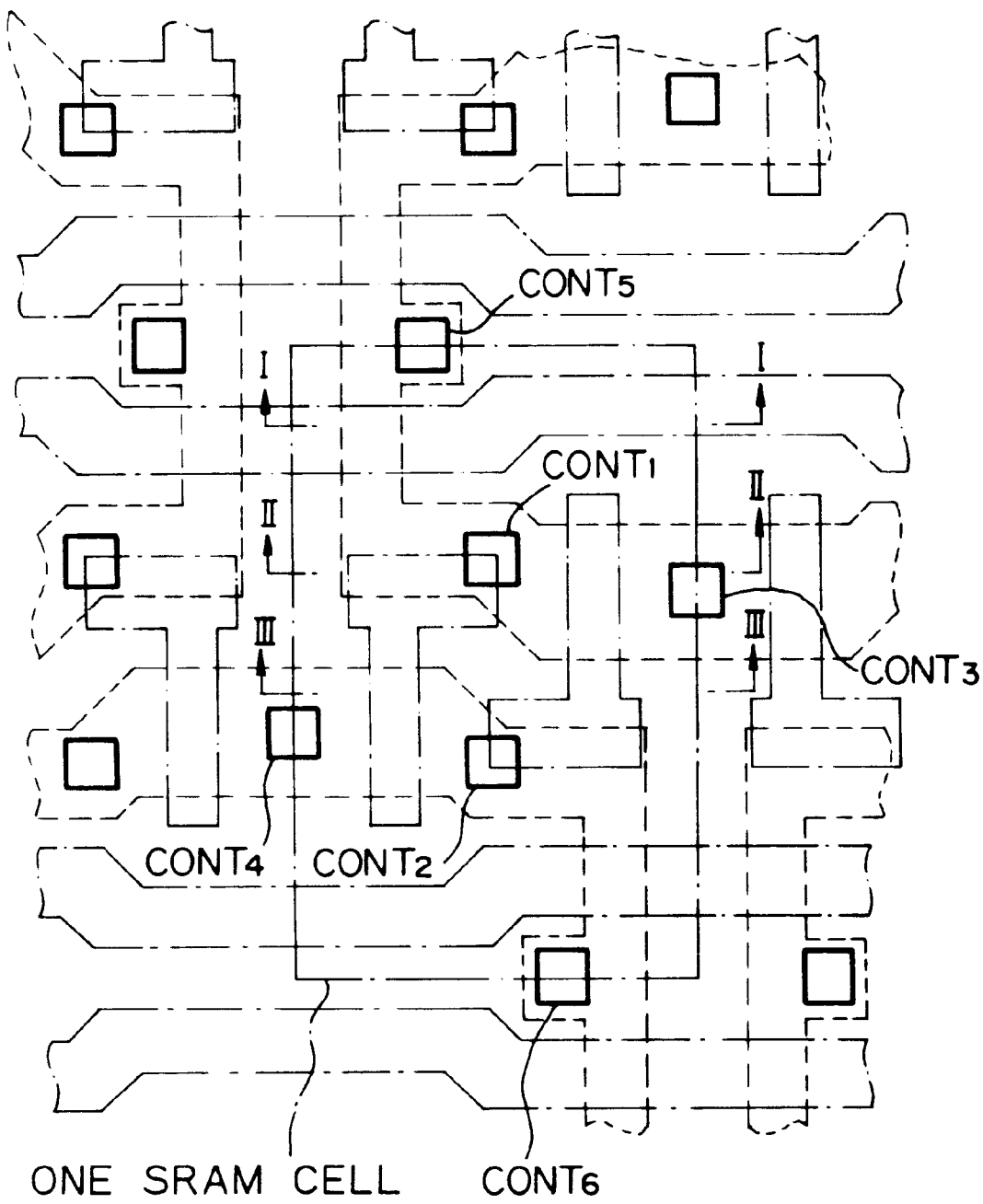
FIG. 23 is a plan view of the contact holes of the SRAM cell of FIG. 17.

In addition, an insulating layer 8 is formed on the entire surface by using a CVD process, and contact holes $CONT_1$ and $CONT_2$ are perforated in the insulating layer 8 as illustrated in FIG. 23. Note that the contact hole $CONT_1$ is used for the resistor $R_1$, and the contact hole $CONT_2$ is used for the resistor $R_2$.

Figure 19:
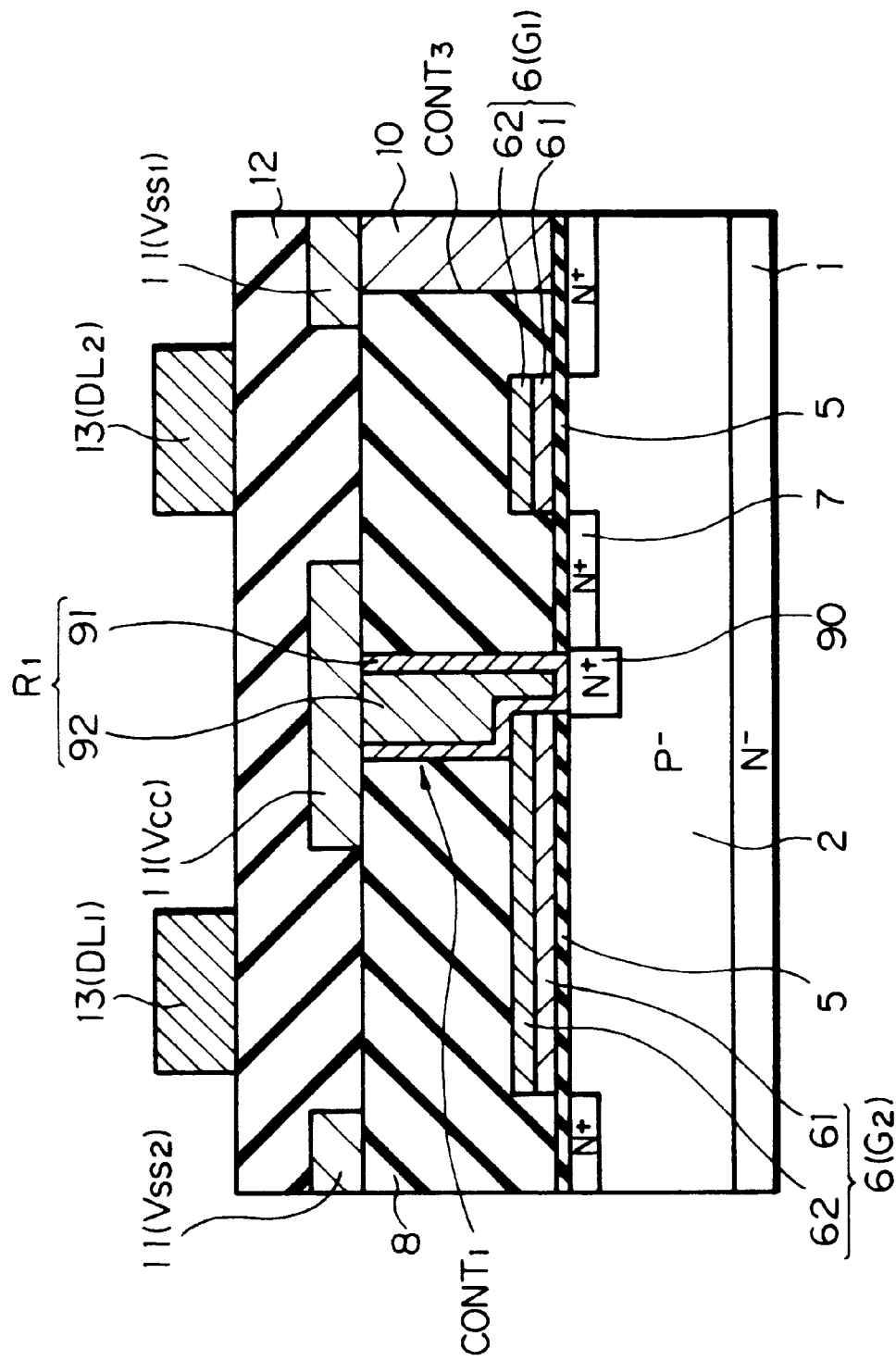
Figure 20:
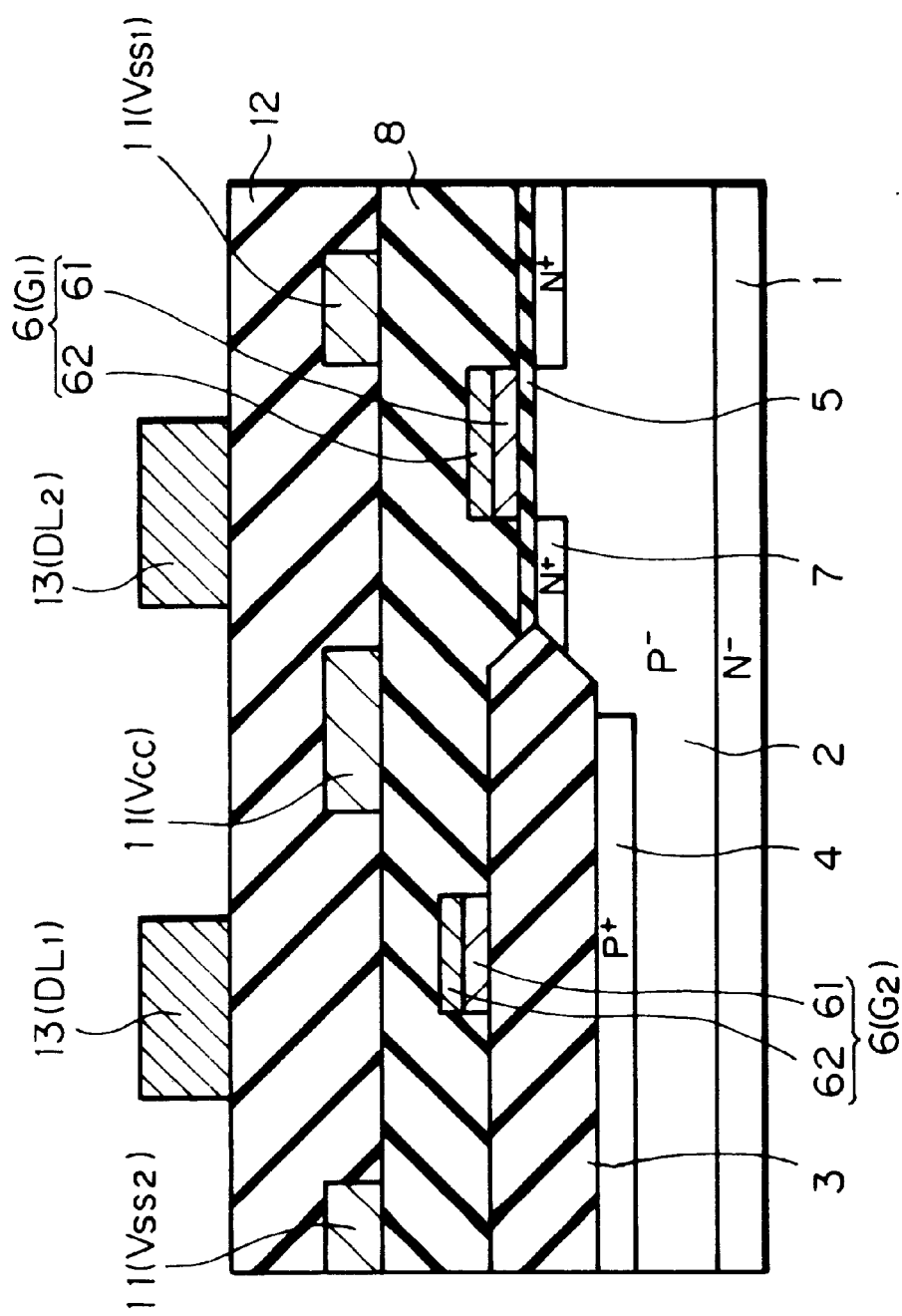

The resistor $R_1$($R_2$) is explained next in detail with reference to FIG. 19. That is, a polycrystalline silicon layer 91 about 20 to 100 nm thick is deposited on the entire surface. Then, about $10^{14}$ to $10^{16}$ phosphorous ions/$cm^2$ are implanted at a normal angle to the surface of the device into the polycrystalline silicon layer 91. As a result, after an annealing operation, the resistance value of the polycrystalline silicon layer 91 at the bottom portion of the contact hole $CONT_1$ ($CONT_2$) becomes low while the resistance value of the polycrystalline silicon layer 91 at the side portion of the contact hole $CONT_1$ ($CONT_2$) remains high. In this case, an $N^+$-type impurity diffusion region 90 is formed within the well 2 and is connected to the $N^+$-type impurity diffusion region 7 of the transistor $Q_{d1}$ ($Q_{d2}$). Also, a polycrystalline silicon layer 92 having a thickness of 100 nm thick or more is deposited on the entire surface, and the polycrystalline silicon layers 91 and 92 on the insulating layer 8 are etched back. Thus, the resistor $R_1(R_2)$ having a high resistance is buried as a contact plug in the contact hole $CONT_1$ ($CONT_2$).

Further, after the formation of the resistors $R_1$ and $R_2$, contact holes $CONT_3$, $CONT_4$, $CONT_5$ and $CONT_6$ are perforated in the insulating layer 8 as illustrated in FIG. 23. In this case, the contact hole $CONT_3$ is used for the ground line $V_{ss1}$, the contact hole $CONT_4$ is used for the ground line $V_{ss2}$, the contact hole $CONT_5$ is used for the data line $DL_1$ and the contact hole $CONT_6$ is used for data line $DL_2$. That is, tungsten plugs 10 are buried in the contact holes $CONT_3$, $CONT_4$, $CONT_5$ and $CONT_6$ by using an etching back process.

Figure 24:
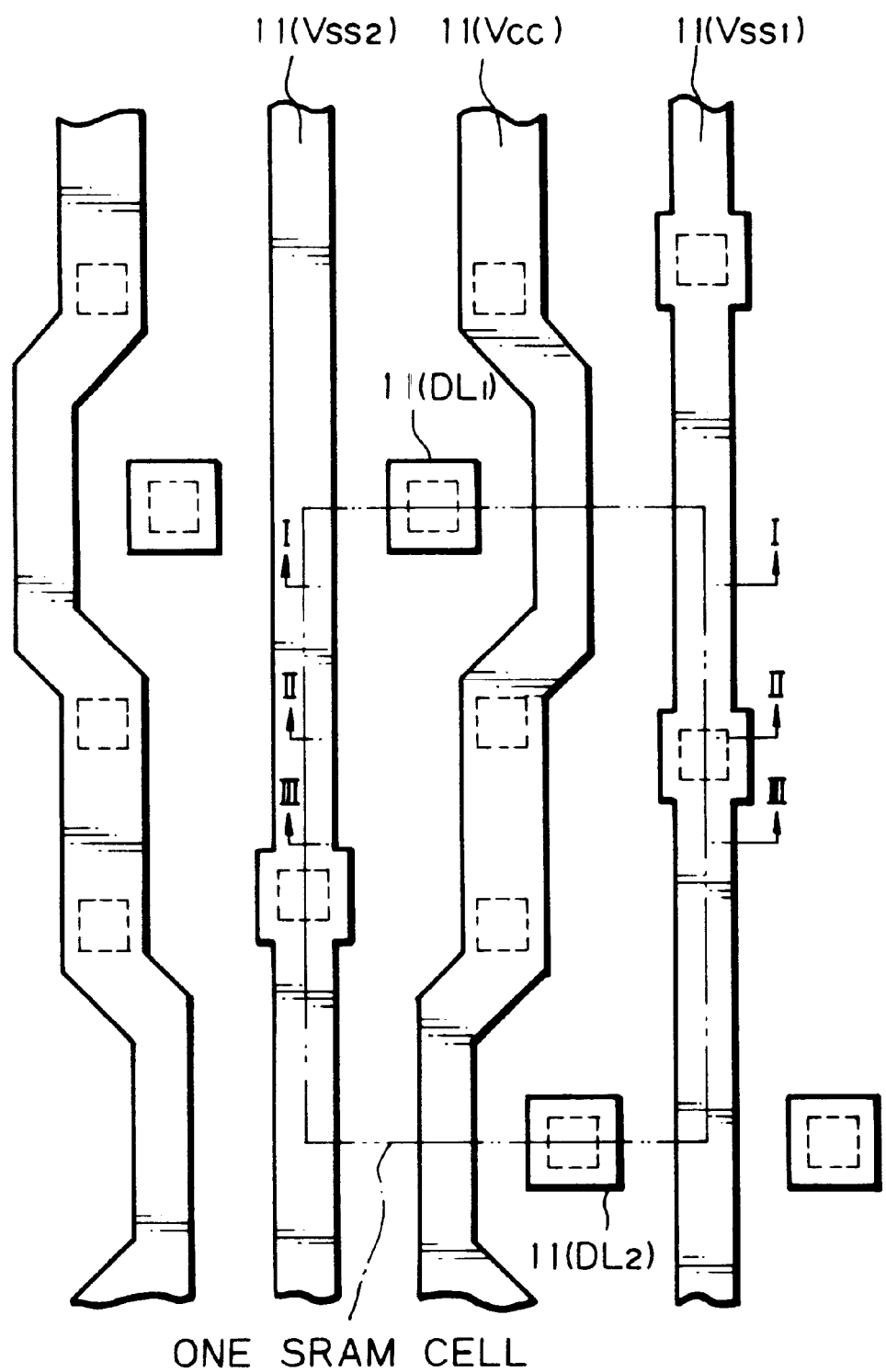
FIG. 24 is a plan view of the high power supply line and ground lines of the SRAM cell of FIG. 17.

In addition, an aluminum layer 11 is deposited and patterned to form the high power supply line $V_{cc}$ and the ground lines $V_{ss1}$ and $V_{ss2}$ as illustrated in FIG. 24. In this case, pads for the data lines $DL_1$ and $DL_2$ are simultaneously formed.

Figure 25:
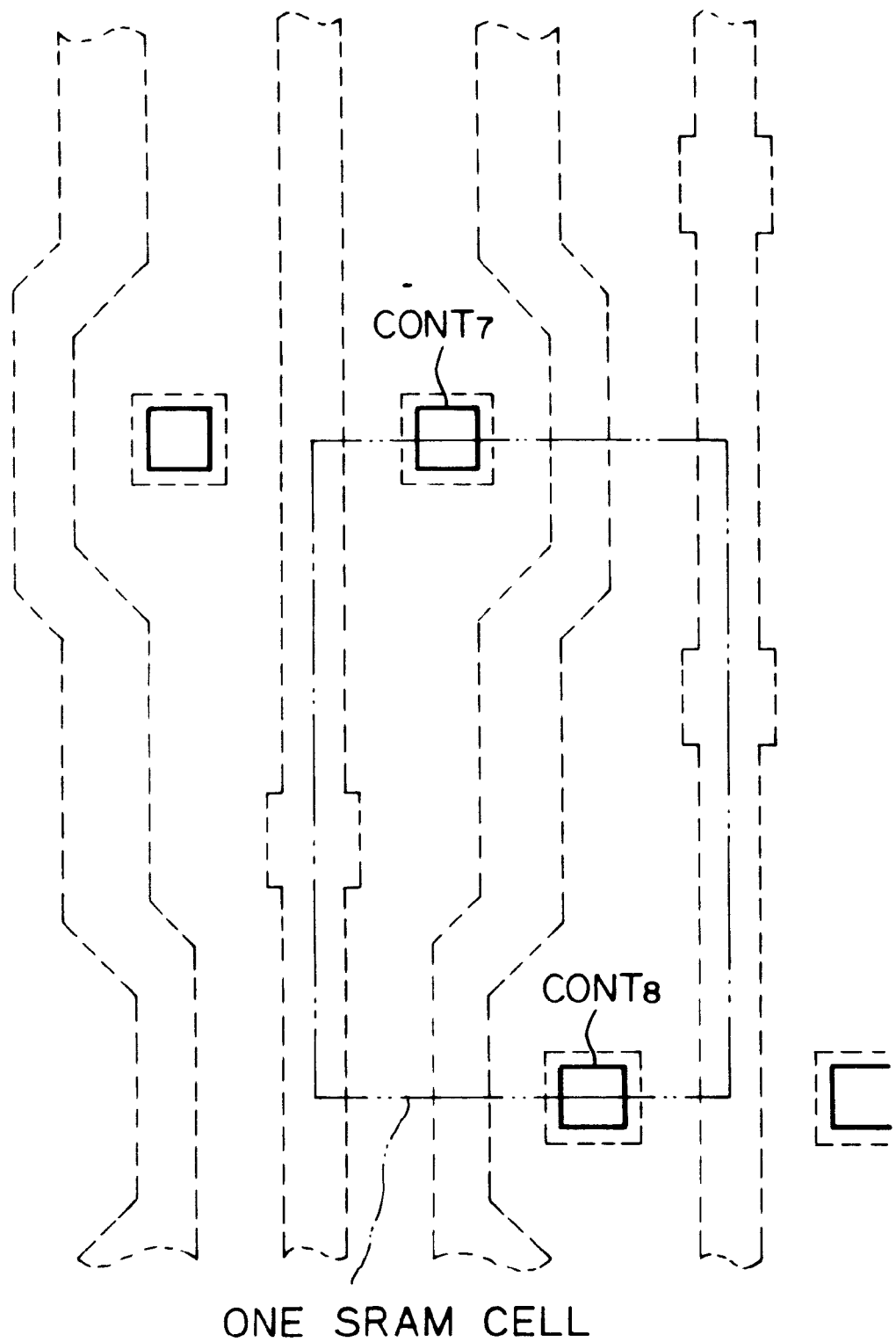
FIG. 25 is a plan view of the contact holes of the SRAM cell of FIG. 17.
Figure 26:
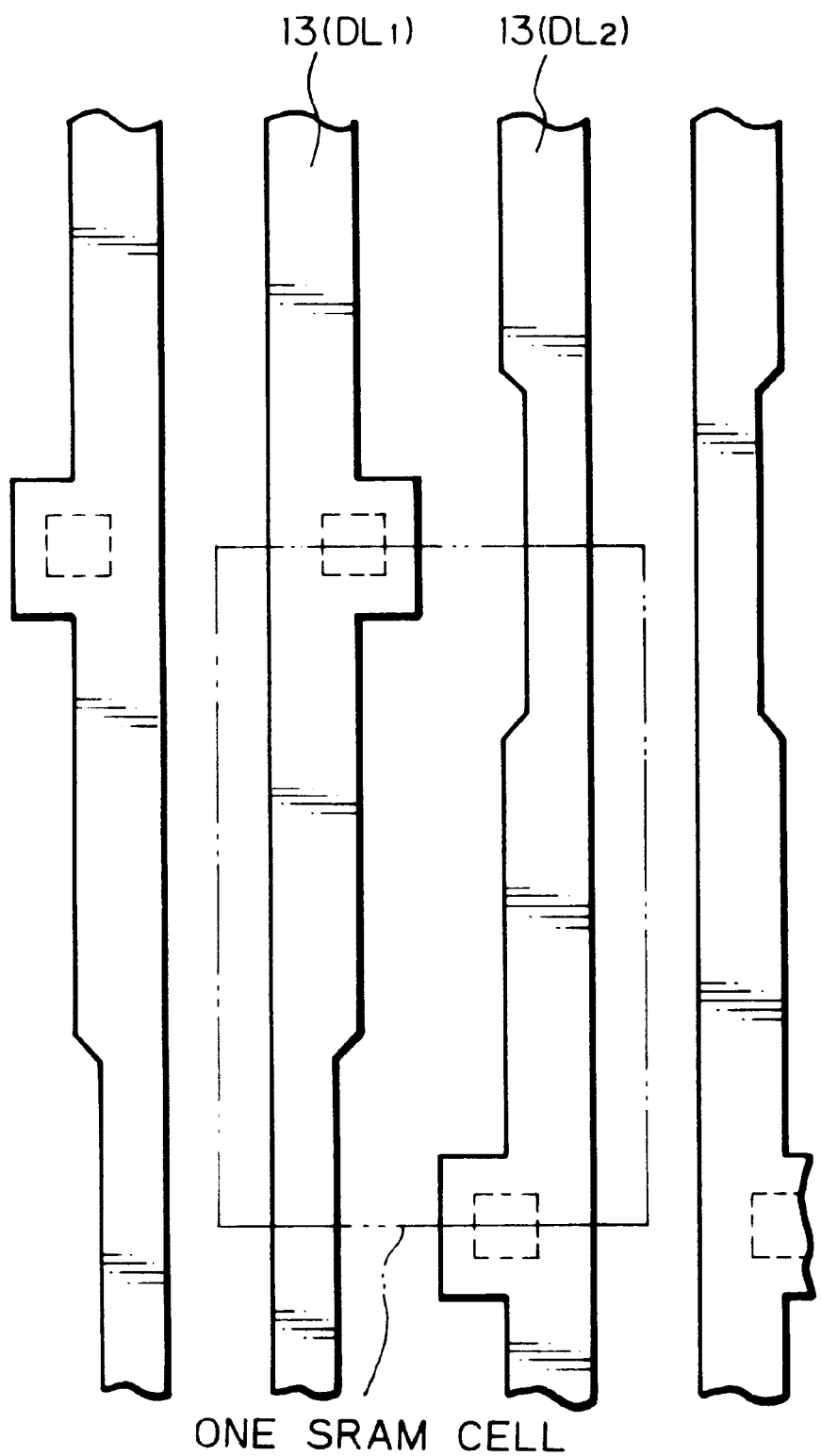
FIG. 26 is a plan view of the data lines of the SRAM cell of FIG. 17.

Finally, an insulating layer 12 is formed on the entire surface by using a CVD process, and contact holes $CONT_7$ and $CONT_8$ are perforated in the insulating layer 112 as illustrated in FIG. 25. In this case, the contact hole $CONT_7$ exposes the pad 11($DL_1$) of FIG. 24, and the contact hole $CONT_8$ exposes the pad 11($DL_2$) of FIG. 24. An aluminum layer 13 as the data lines $DL_1$ and $DL_2$ is formed on the insulating layer 12 and is connected via the contact holes $CONT_7$ and $CONT_8$ to the sources of the transfer transistors $Q_{t1}$ and $Q_{t2}$, respectively as illustrated in FIG. 26.

In the SRAM cell as illustrated in FIGS. 16 through 26, since the data line $DL_1$ ($DL_2$) does not cross over the power supply line $V_{cc}$ or the ground line $V_{ss1}$ ($V_{ss2}$), capacitances formed by the data lines $DL_1$ and $DL_2$ and the lines $V_{cc}$, $V_{ss1}$ and $V_{ss2}$ with the silicon oxide layers 8 and 12 therebetween are so small as to suppress the increase of the parasitic capacitances of the data lines $DL_1$ and $DL_2$, which increases the access speed to the SRAM cell.

Figure 27:
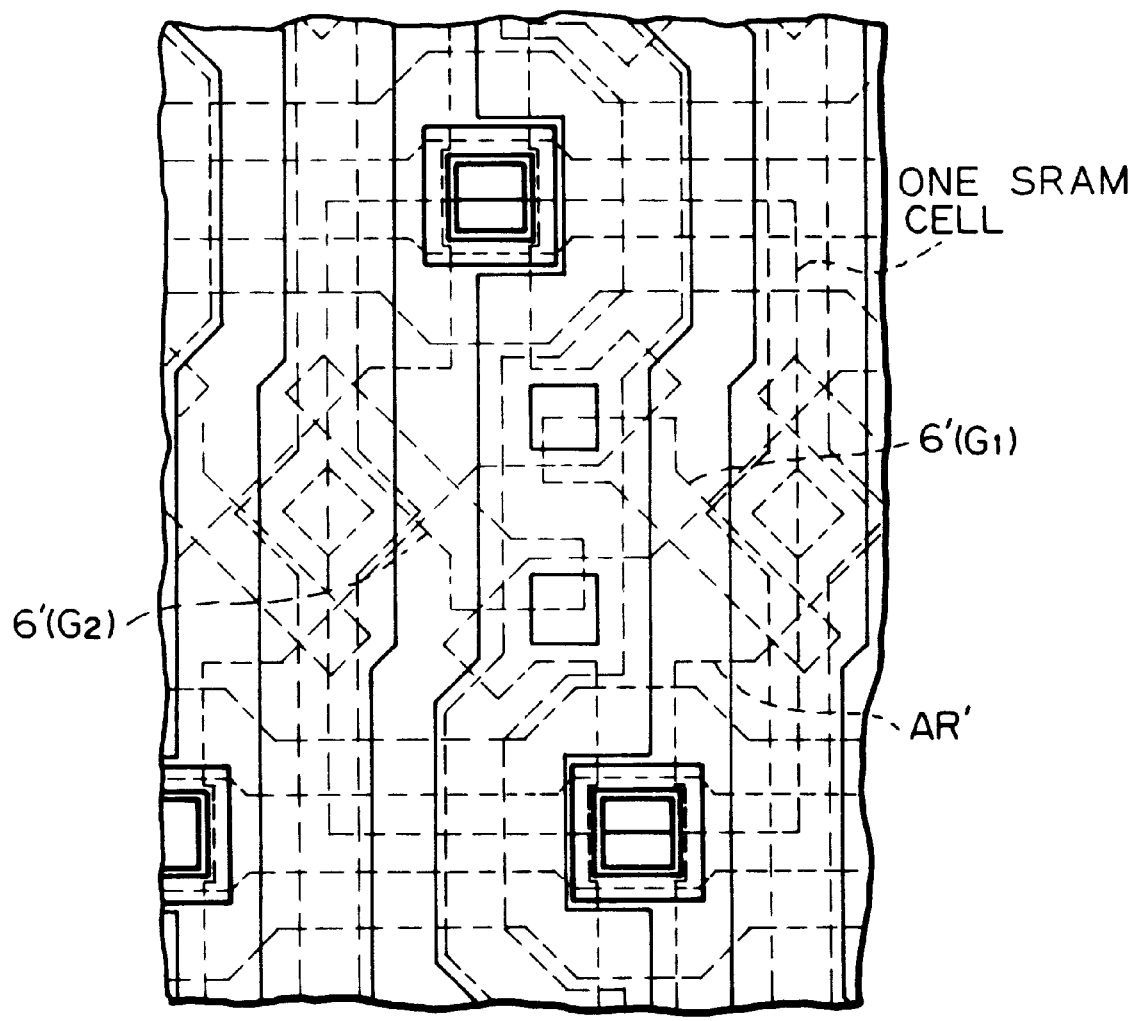
FIG. 27 is a plan view illustrating a second embodiment of the symmetrical resistor-type SRAM cell according to the present invention.
Figure 28:
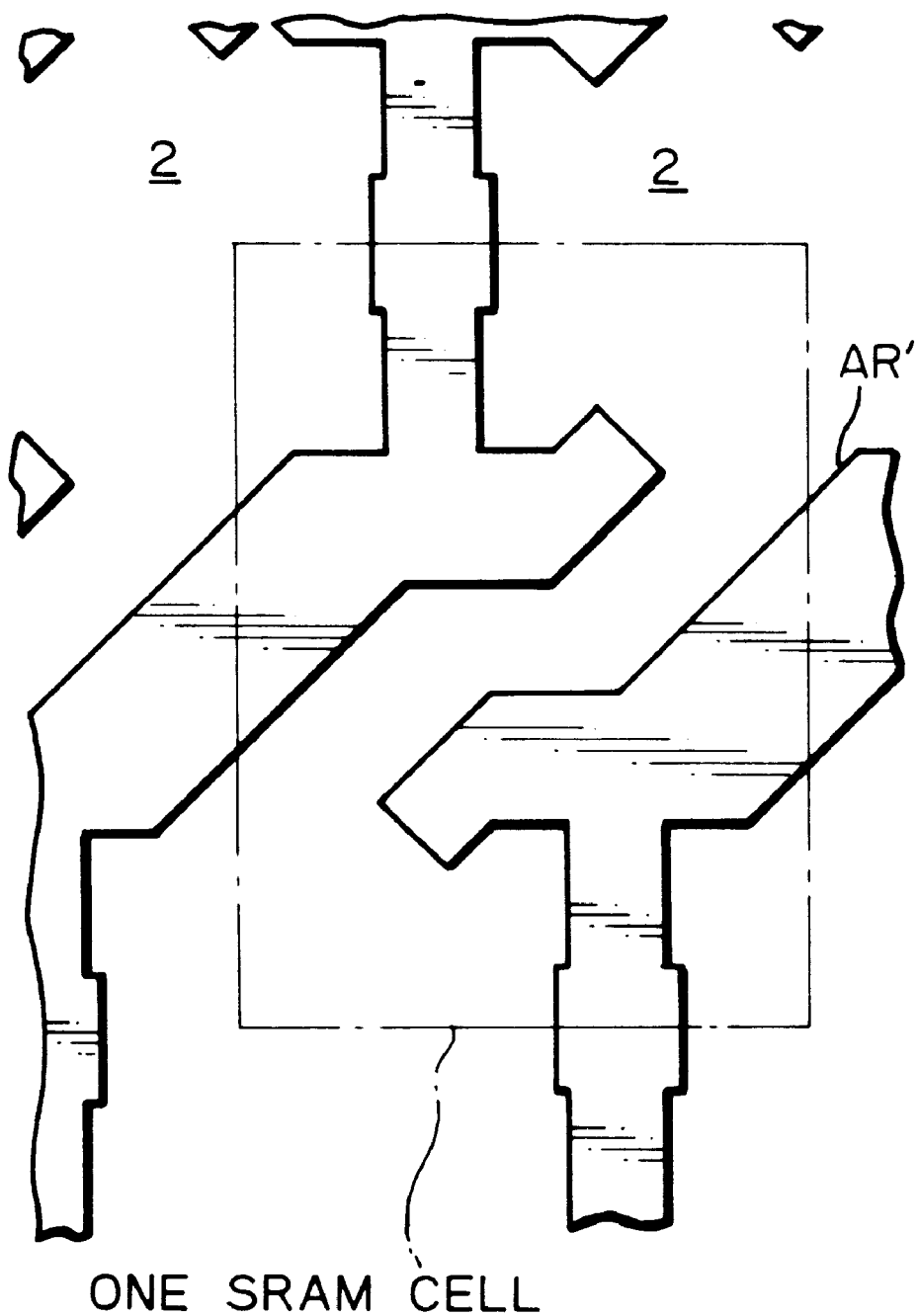
FIG. 28 is a plan view of the active area of the SRAM cell of FIG. 27.
Figure 29:
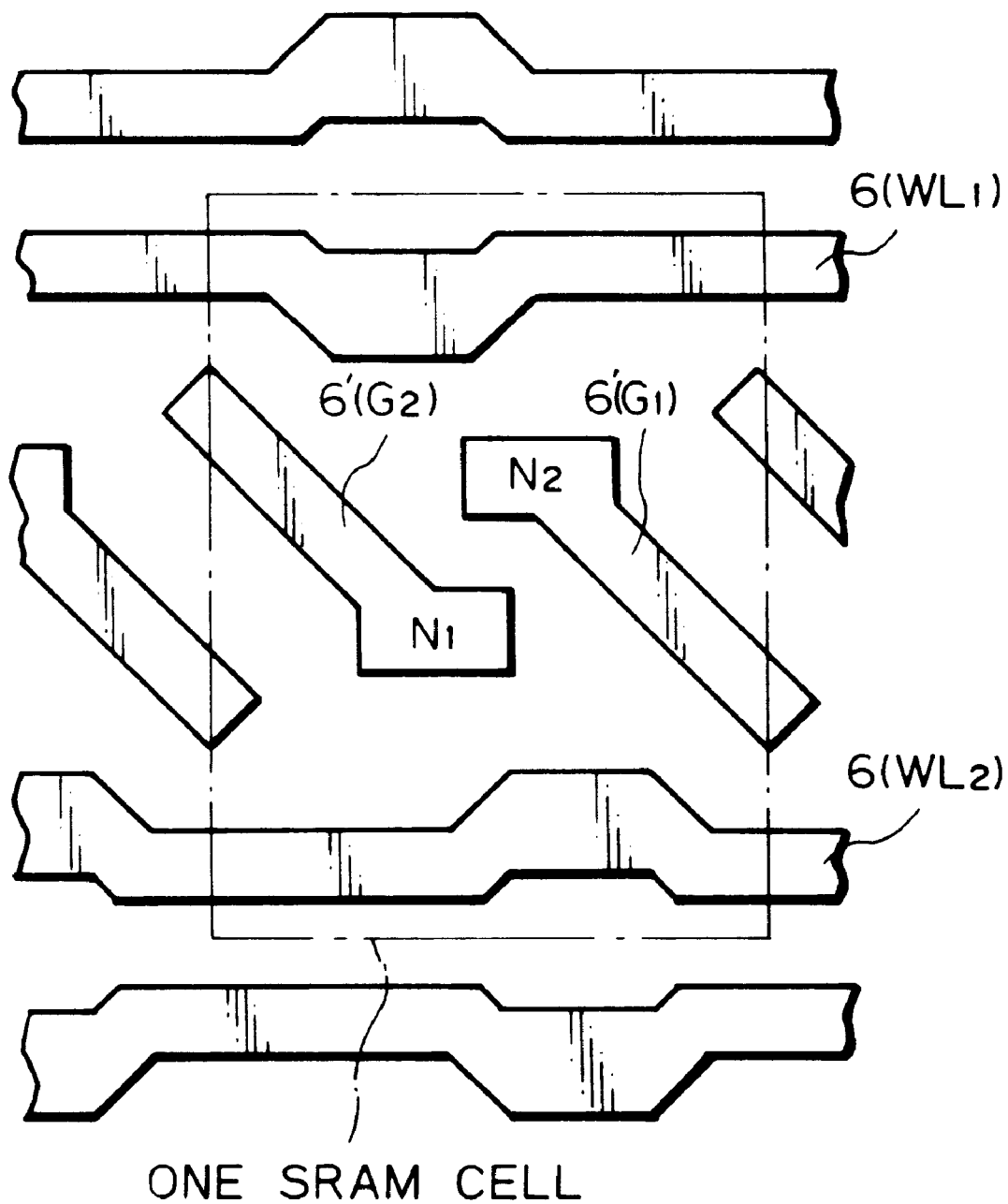
FIG. 29 is a plan view of the gate electrode of the SRAM cell of FIG. 27.

In FIG. 27, which is a plan view illustrating a second embodiment of the SRAM cell according to the present invention, an active area AR' is sloped with respect to the word lines, and the gates 6'($G_1$) and 6'($G_2$) of the transistors $Q_{d1}$ and $Q_{d2}$ are also sloped or diagonal with respect to the word lines. The active area AR' is illustrated in detail in FIG. 28, and the gates of the transistors $Q_{d1}$ and $Q_{d2}$ are illustrated in detail in FIG. 29. The configuration, other than for the active area AR' and the gates 6'($G_1$) and 6'($G_2$), is substantially the same as that of FIG. 17.

In the second embodiment, the length of each SRAM cell in a direction perpendicular to the word lines is decreased. Also, the length of the data lines $DL_1$ and $DL_2$ is decreased. On the other hand, since the length of each SRAM cell in a direction horizontal to the word lines is a little increased, the distance of the data lines $DL_1$ and $DL_2$ is increased. Therefore, the parasitic capacitances of the data lines $DL_1$ and $DL_2$ are decreased, which further increases the access speed of the SRAM cell.

As explained hereinabove, according to the present invention, since the data lines do not cross over either the high power supply lines or the ground lines, the parasitic capacitances of the data lines are decreased, so that the access speed can be increased.

I claim:

1. A static memory cell formed in a unit cell area, comprising:

at least one word line arranged along a first direction;

a first power supply line arranged along a second direction perpendicular to said first direction;

at least one second power supply line arranged along said second direction;

first and second data lines arranged along said second direction, said first and second data lines not crossing over said first and second power supply lines;

a first load resistor connected between said first power supply line and a first node;

a second load resistor connected between said first power supply line and a second node;

a first drive transistor connected between said first node and said second power supply line and having a gate connected to said second node;

a second drive transistor connected between said second node and said second power supply line and having a gate connected to said first node;

a first transfer transistor connected between said first data line and said first node and having a gate connected to said word line; and a second transfer transistor connected between said second data line and said second node and having a gate connected to said word line.

2. The static memory cell as set forth in claim 1, wherein said first and second data lines are separated from said first and second power supply lines by an insulating layer.

3. The static memory cell as set forth in claim 1, wherein each of said first and second load resistors comprises a contact plugs buried in a contact hole of an insulating layer, said contact hole being located at an approximate center of said unit cell area.

4. The static memory cell as set forth in claim 3, wherein said first and second load resistors are arranged in a line along said second direction.

5. The static memory cell as set forth in claim 1, wherein said second power supply line is connected to said first and second drive transistors at ends of said cell area.

6. The static memory cell as set forth in claim 1, wherein said first and second data lines are connected to said first and second transfer transistors at ends of said cell area.

7. The static memory cell as set forth in claim 1, wherein said first and second power supply lines are formed by a first conductive layer, said first and second data lines being formed by a second conductive layer.

8. The static memory cell as set forth in claim 1, wherein a gate electrode of each of said first and second drive transistors is sloped with respect to said first and second directions.

9. A static memory cell formed in a unit cell area, comprising:

first and second word lines arranged along a first direction and being at the same voltage level;

a power supply line arranged along a second direction perpendicular to said first direction;

first and second ground lines arranged along said second direction;

first and second data lines arranged along said second direction, said first and second data lines not crossing over said power supply line and said first and second ground lines;

a first load resistor connected between said power supply line and a first node;

a second load resistor connected between said power supply line and a second node;

a first drive transistor connected between said first node and said first ground line and having a gate connected to said second node;

a second drive transistor connected between said second node and said second ground line and having a gate connected to said first node;

a first transfer transistor connected between said first data line and said first node and having a gate connected to said first word line;

a second transfer transistor connected between said second date line and said second node and having a gate connected to said second word line.

10. The static memory cell as set forth in claim 9, wherein said first and second data lines are separated from said first and second power supply lines by an insulating layer.

11. The static memory cell as set forth in claim 9, wherein each of said first and second load resistors comprises a contact plug buried in a contact hole of an insulating layer, said contact hole being located at an approximate center of said unit cell area.

12. The static memory cell as set forth in claim 11, wherein said first and second load resistors are arranged in a line along said second direction.

13. The static memory cell as set forth in claim 9, wherein said first and second power supply lines are connected to said first and second drive transistors, respectively, at ends of said unit cell area.

14. The static memory cell as set forth in claim 9, wherein said first and second data lines are connected to said first and second transfer transistors at ends of said unit cell area.

15. The static memory cell as set forth in claim 9, wherein said power supply line and said first and second ground lines are formed by a first conductive layer, said first and second data lines being formed by a second conductive layer.

16. The static memory cell as set forth in claim 9, wherein said first and second word lines, said power supply line, said first and second ground lines, said first and second load resistors, said first and second drive transistors and said first and second transfer transistors are symmetrically disposed with respect to a center of said unit cell area.

17. The static memory cell as set forth in claim 9, wherein a gate electrode of each of said first and second drive transistors is sloped with respect to said first and second directions.

* * * * *